US011380756B2

(12) United States Patent
Leendertz et al.

(10) Patent No.: US 11,380,756 B2
(45) Date of Patent: Jul. 5, 2022

(54) SILICON CARBIDE DEVICE WITH SCHOTTKY CONTACT

(71) Applicant: Infineon Technologies AG, Neubiberg (DE)

(72) Inventors: Caspar Leendertz, Munich (DE); Rudolf Elpelt, Erlangen (DE); Romain Esteve, Prisdorf (DE); Thomas Ganner, Krumpendorf (AT); Jens Peter Konrath, Villach (AT); Larissa Wehrhahn-Kilian, Erlangen (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 46 days.

(21) Appl. No.: 16/733,329

(22) Filed: Jan. 3, 2020

(65) Prior Publication Data
US 2020/0219972 A1 Jul. 9, 2020

(30) Foreign Application Priority Data

Jan. 4, 2019 (DE) .......................... 102019100110.2
Nov. 11, 2019 (DE) .......................... 102019130376.1

(51) Int. Cl.
H01L 29/06 (2006.01)
H01L 29/16 (2006.01)
H01L 29/45 (2006.01)
H01L 29/47 (2006.01)

(52) U.S. Cl.
CPC ...... H01L 29/0619 (2013.01); H01L 29/1608 (2013.01); H01L 29/45 (2013.01); H01L 29/47 (2013.01)

(58) Field of Classification Search
CPC ..... H01L 29/06; H01L 29/0619; H01L 29/16; H01L 29/1608; H01L 29/45; H01L 29/47
USPC .......................................................... 257/77
See application file for complete search history.

(56) References Cited

U.S. PATENT DOCUMENTS

2005/0285188 A1 12/2005 Khemka et al.
2014/0175508 A1* 6/2014 Suzuki
2017/0345905 A1* 11/2017 Siemieniec ......... H01L 29/4236

* cited by examiner

Primary Examiner — Fazli Erdem
(74) Attorney, Agent, or Firm — Cooper Legal Group LLC

(57) ABSTRACT

A silicon carbide device includes a silicon carbide body including a source region of a first conductivity type, a cathode region of the first conductivity type and separation regions of a second conductivity type. A stripe-shaped gate structure extends along a first direction and adjoins the source region and the separation regions. The silicon carbide device includes a first load electrode. Along the first direction, the cathode region is between two separation regions of the separation regions and at least one separation region of the separation regions is between the cathode region and the source region. The source region and the first load electrode form an ohmic contact. The first load electrode and the cathode region form a Schottky contact.

20 Claims, 21 Drawing Sheets

SILICON CARBIDE DEVICE WITH SCHOTTKY CONTACT

RELATED APPLICATIONS

This application claims priority to German Patent Application No. 102019100110.2, filed on Jan. 4, 2019, entitled "SILICON CARBIDE DEVICE WITH SCHOTTKY CONTACT", and German Patent Application No. 102019130376.1, filed on Nov. 11, 2019, entitled "SILICON CARBIDE DEVICE WITH SCHOTTKY CONTACT", both of which are incorporated by reference herein in their entirety.

TECHNICAL FIELD

The present disclosure is related to silicon carbide devices, for example, to silicon carbide devices with transistor cells and Schottky contacts.

BACKGROUND

Power semiconductor devices are typically used as switches and rectifiers in electric circuits for transforming electrical energy, for example, in DC/AC converters, AC/AC converters or AC/DC converters, and in electric circuits that drive heavy inductive loads, e.g., in motor driver circuits. The dielectric breakdown field strength of silicon carbide (SiC) is high compared to silicon. Therefore, SiC devices may be significantly thinner than equivalent silicon devices with the same nominal blocking voltage. On the other hand, electrical parameters of silicon carbide devices tend to deteriorate at a higher rate than it is typically the case for equivalent silicon devices.

There is a need for improving long-term stability of silicon carbide device parameters.

SUMMARY

An embodiment of the present disclosure relates to a silicon carbide device that includes a silicon carbide body. The silicon carbide body includes a source region of a first conductivity type, a cathode region of the first conductivity type and separation regions of a second conductivity type. The silicon carbide device includes a stripe-shaped gate structure. The stripe-shaped gate structure extends along a first direction and adjoins the source region and the separation regions. The silicon carbide device includes a first load electrode. Along the first direction, the cathode region is between two separation regions of the separation regions and at least one separation region of the separation regions is between the cathode region and the source region. The first load electrode and the source region form an ohmic contact. The first load electrode and the cathode region form a Schottky contact.

An embodiment of the present disclosure relates to a silicon carbide device that includes a silicon carbide body. The silicon carbide body includes a source region, a cathode region and separation regions. The silicon carbide device includes a stripe-shaped gate structure. The stripe-shaped gate structure extends along a first direction and adjoins the source region and the separation regions. The silicon carbide device includes a first load electrode. Along the first direction, the cathode region is between two separation regions of the separation regions and at least one separation region of the separation regions is between the cathode region and the source region. The first load electrode and the source region form an ohmic contact. The first load electrode and the cathode region form a Schottky contact.

An embodiment of the present disclosure relates to a silicon carbide device that includes a silicon carbide body. The silicon carbide body includes a source region, a cathode region and separation regions. The silicon carbide device includes a stripe-shaped gate structure. The stripe-shaped gate structure extends along a first direction and adjoins the source region and the separation regions. The silicon carbide device includes a first load electrode. Along the first direction, the cathode region is between two separation regions of the separation regions and at least one separation region of the separation regions is between the cathode region and the source region. The first load electrode and the source region form an ohmic contact. The first load electrode and the cathode region form a Schottky contact. The stripe-shaped gate structure extends from a first surface of the silicon carbide body into the silicon carbide body.

BRIEF DESCRIPTION OF THE DRAWINGS

The accompanying drawings are included to provide a further understanding of the embodiments and are incorporated in and constitute a part of this specification. The drawings illustrate embodiments of a silicon carbide device and together with the description serve to explain principles of the embodiments.

Further embodiments are described in the following detailed description and the claims.

DETAILED DESCRIPTION

Figure 1A:
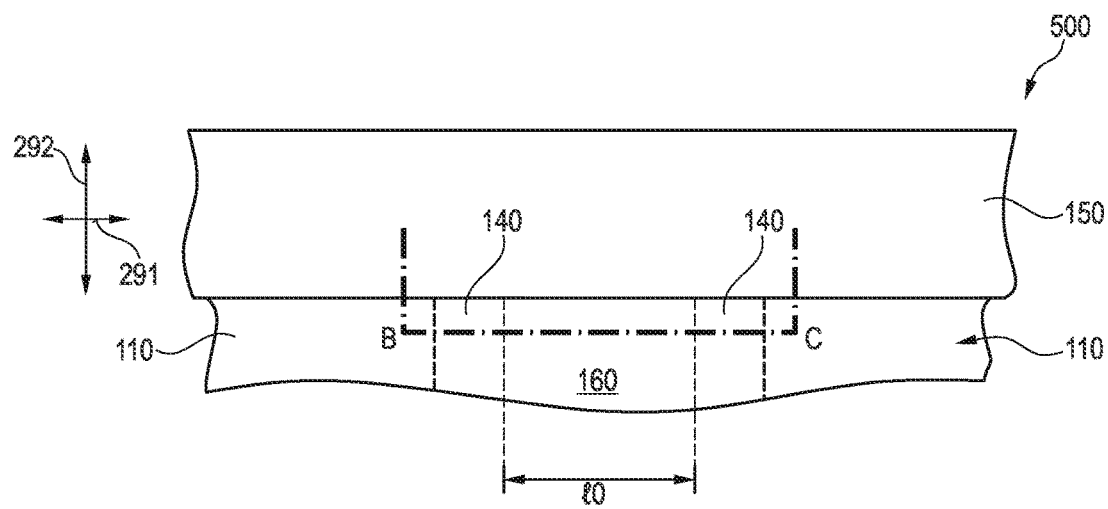
FIGS. 1A-1B illustrate schematic plan and vertical cross-sectional views of a portion of a silicon carbide device with a Schottky contact between two transistor cells according to an embodiment.

In the following detailed description, reference is made to the accompanying drawings, which form a part hereof and in which are shown by way of illustrations specific embodiments in which a silicon carbide device may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be connected between the electrically coupled elements, for example, elements that are controllable to temporarily provide a low-resistive connection in a first state and a high-resistive electric decoupling in a second state.

An ohmic contact is a non-rectifying electrical junction with a linear or almost linear current-voltage characteristic. A Schottky contact is a metal-semiconductor junction with rectifying characteristics, wherein the work function of the metal and the dopant concentration in the semiconductor material are selected such that in the absence of an externally applied electric field a depletion zone forms in the semiconductor material along the metal-semiconductor junction. In the context of a Schottky contact, the term "metal-semiconductor junction" may also refer to a junction between a metal-like semiconductor and a semiconductor, wherein the junction has the same characteristics as a metal-semiconductor junction. For example, it may be possible to form a Schottky contact between polycrystalline silicon and silicon carbide. If two components (e.g., two regions) form an ohmic contact or a Schottky contact, respectively, this may mean that an ohmic contact or a Schottky contact is present between said two components. In both cases, it may be possible for said two regions to adjoin (e.g., directly adjoin) each other. However, it may also be possible that a further component is positioned between said two components.

A safe operating area (SOA) defines voltage and current conditions over which a semiconductor device can be expected to operate without self-damage. The SOA is given by published maximum values for device parameters like maximum continuous load current, maximum gate voltage and others.

The Figures illustrate relative doping concentrations by indicating "−" or "+" next to the doping type "n" or "p". For example, "n-" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Two adjoining doping regions of the same conductivity type and with different dopant concentrations form a unipolar junction, e.g., an n/n+ or p/p+ junction along a boundary surface between the two doping regions. At the unipolar junction a dopant concentration profile orthogonal to the unipolar junction may show a step or a turning point, at which the dopant concentration profile changes from being concave to convex, or vice versa.

Ranges given for physical dimensions include the boundary values. For example, a range for a parameter y from a to b reads as a≤y≤b. The same holds for ranges with one boundary value like "at most" and "at least".

Main constituents of a layer or a structure from a chemical compound or alloy are such elements which atoms form the chemical compound or alloy. For example, nickel and silicon are the main constituents of a nickel silicide layer and copper and aluminum are the main constituents of a copper aluminum alloy.

According to an embodiment, a silicon carbide device may include a silicon carbide body with a source region of a first conductivity type, a cathode region of the first conductivity type and with separation regions of a second, complementary conductivity type. A stripe-shaped gate structure may extend along a first direction and may adjoin (e.g., directly adjoin) the source region and the separation regions. The first direction may be a lateral direction of the silicon carbide body.

Along the lateral first direction, the cathode region is located between two of the separation regions. In some embodiments, exactly one cathode region may be located between two of the separation regions. At least one of (e.g., exactly one of) the separation regions is located between the cathode region and the source region. Each separation region may separate a cathode region and a source region. A first load electrode and the source region form an ohmic contact. The first load electrode and the cathode region form a Schottky contact. In at least one embodiment, the first load electrode may also form an ohmic contact with the separation regions. Alternatively and/or additionally, it may be possible that the first load electrode forms an ohmic contact with a source region and/or a body region and/or a shielding region.

The source region may form part of a transistor cell such that along the first direction a Schottky contact may be formed between two transistor cells.

In at least one operational mode of the semiconductor device, e.g., a reverse conducting mode, a bipolar current including holes and electrons flows through the silicon carbide body, wherein the bipolar current passes at least a pn junction of the transistor cell. For example, in the vicinity of the pn junctions and further, if applicable, in the vicinity of unipolar junctions, holes and electrons may recombine at a more than insignificant rate. The recombination may set free energy (e.g. thermal energy) and/or momentum that may promote bipolar degradation. Bipolar degradation denotes the growth of preexisting crystallographic defects. For example, BPD (basal plane dislocations) between neighboring lattice planes may transform into SSFs (Shockley stalking faults) which grow along the lattice planes in a direction that is predominately transversal to a vertical load current flow through the silicon carbide body such that the lattice defects may increasingly impede the vertical load current flow through the silicon carbide body.

A forward voltage drop across a Schottky contact in silicon carbide is typically lower than a forward voltage drop across a pn junction in silicon carbide such that a reverse current through the silicon carbide body predominantly flows through the Schottky contact. In silicon carbide devices with high nominal blocking voltage of at least 3.3 kV, the resistance of the drift zone typically dominates the total on-state resistance, whereas the channel resistance only marginally contributes to the total on-state resistance. In such devices, the area loss due to the Schottky contact increases the on-state resistance only to a comparatively low degree. The reduced overall channel width may also contribute to improving short-circuit ruggedness.

The ratio between a Schottky contact area of the Schottky contact and the transistor area of the transistor cell can, for example, be adjusted by adjusting the ratio between a length of the cathode region and a length of the source region along the first direction. The cathode region may be defined by masking implants that define the transistor cell, e.g., by masking implants that define a source region, a body region and/or a shielding region of the transistor cell.

At least one of the separation regions may isolate and/or shield the cathode region from the source region. The separation regions may be shaped and arranged to improve the shielding of the transistor channel to reduce DIBL (drain induced barrier lowering) and to shield the Schottky contact against electric fields to reduce a leakage current through the Schottky contact.

According to an embodiment, the gate structure includes a gate electrode formed on a first surface of the silicon carbide body. In other words, the gate electrode may be a planar gate electrode. By implementing the cathode region and the separation regions, established designs for silicon carbide transistors may be modified for increased long term reliability, reduced DIBL, and/or improved short-circuit ruggedness.

According to an embodiment, the gate structure may extend from a first surface of the silicon carbide body into the silicon carbide body, for example, along a vertical direction that runs perpendicular to the first direction. In other words, the gate structure may be a trench gate structure. The trench gate structure facilitates a vertical transistor channel, which may allow for higher area efficiency. Therefore, the cathode region and the separation regions may be implemented with small structural sizes (e.g., a size of the cathode region and/or the separation regions may be less than a threshold size) and/or with high area efficiency. For example, it may be possible to provide the cathode region and the separation region, while still maintaining a high channel density for the MOSFET channel.

According to an embodiment, the silicon carbide body includes a body region of the second conductivity type and a drift structure. The body region and the drift structure form a first pn junction. Separately or in combination, the body region may adjoin (e.g., directly adjoin) the drift structure. The first load electrode and the body region form an ohmic contact. The lower forward voltage drop across the Schottky contact compared to the forward voltage drop across the first pn junction may suppress or at least reduce (e.g., significantly reduce) a bipolar current across the first pn junction and may avoid or at least reduce (e.g., significantly reduce) bipolar degradation.

According to an embodiment, a first vertical extension of the separation regions (e.g., each of the separation regions) is equal to or smaller than a maximum vertical distance between the first pn junction and the first surface. For example, along the vertical direction, the body region may extend at least as deep as or even deeper into the silicon carbide body than each of the separation regions. Comparatively shallow separation regions with a vertical extension not greater than the maximum vertical distance between the first pn junction and the first surface may facilitate lateral current spreading just below the separation regions and in this way may contribute to a reduction of the ohmic resistance of a JFET (junction field effect transistor) structure, which the separation regions and/or further p-doped regions may form around the Schottky contact, e.g. below the body region.

The maximum vertical distance between the first pn junction and the first surface may correspond to a maximum vertical extension of the body region. For example, the body region may include a heavily doped body contact region adjoining (e.g., directly adjoining) the first load electrode and the first vertical extension of the separation regions may be equal to a vertical extension of the body contact portion. A maximum dopant concentration in the body contact portion may be equal to a maximum dopant concentration in the separation regions. It is possible that the separation regions are formed in the same process act as the body contact portion without an additional implant process, for example by modifying an implant mask used for defining the body contact portions.

According to an embodiment, the first vertical extension of the separation regions may be greater than a maximum vertical distance between the first pn junction and the first surface. For example, along the vertical direction, the separation regions may extend deeper into the silicon carbide body than the body region. A comparatively large vertical extension of the separation regions may facilitate a shielding of the transistor channels from more than two lateral sides and may also improve the shielding of the Schottky contact against high electric field strength. For example, the cathode region and adjoining separation region may form an MPS (merged-pin Schottky) diode structure.

The silicon carbide device may include a shielding region of the second conductivity type. The shielding region may form a pn junction with the drift structure and/or may adjoin (e.g., directly adjoin) the drift structure. The shielding region and the first load electrode may form an ohmic contact. For example, the first vertical extension may be equal to a maximum vertical distance between the first surface and the pn junction between the shielding region and the drift structure. The vertical extension of the shielding region may be greater than a vertical extension of a trench gate structure.

According to an embodiment, the drift structure may include a drift zone of the first conductivity type. The drift zone may be lightly doped, i.e., may have a lower doping concentration than the source region and/or the cathode region. The cathode region and the drift structure may form a unipolar junction. A maximum dopant concentration in the cathode region may be at least double, e.g., at least ten times higher than, as a maximum dopant concentration in the drift zone. A higher dopant concentration in the cathode region may reduce the ohmic resistance between the Schottky contact and the drift zone and may define an appropriate forward voltage drop at the Schottky contact.

The formation of the cathode region may be combined with the formation of a current spread region between the drift zone and the body region. For example, at least a portion of the cathode region may be formed with the same implant defining the current spread region and without additional process acts by, e.g., modifying an implant mask for the current spread region. A current spread region may be a region that prevents generation of a space-charge region via a current-driven voltage drop. For example, the current spread region may have a higher doping concentration than an adjoining drift zone.

According to an embodiment, the silicon carbide device may include at least one dividing region of the second conductivity type, wherein the at least one dividing region may separate the cathode region into at least two cathode portions along the first direction. The at least one dividing region may have the same vertical extension as the separation regions, the same maximum dopant concentration as the separation regions, and/or the same vertical dopant profile as the separation regions. The dividing regions may further fine-tune the shielding characteristics for the Schottky contact.

According to an embodiment a plurality of cathode regions and a plurality of source regions may be arranged along the first direction. Each of the cathode regions may be located between two of the separation regions. At least one of (e.g., exactly one of) the separation regions is located between at least one of (e.g., exactly one of) the cathode regions and at least one of (e.g., exactly one of) the source regions. Along the first direction, the source regions may alternate with the cathode regions, wherein the separation regions may separate each cathode region from the two neighboring source regions along the first direction.

A desired ratio of the Schottky contact area to the transistor area may be adjusted by selecting a total length of the cathode regions along the first direction. Transistor current and Schottky current can be evenly distributed across the lateral cross-sectional area of the silicon carbide body. The length of the cathode regions along the first direction and the vertical extension of the separation regions may adjust the shielding characteristics for the Schottky contacts and the transistor channel.

According to an embodiment, the source region adjoins (e.g., directly adjoins) a first gate sidewall of the gate structure. A shielding region of the second conductivity type may adjoin (e.g., directly adjoin) a second gate sidewall of the gate structure. The second gate sidewall may be opposite to the first gate sidewall. The first and the second gate sidewall may both extend along the first direction (i.e., may be longitudinal sidewalls of the gate structure). The source region may be located opposite (e.g., directly opposite) to the shielding region with respect to the gate structure. The transistor cell may thus be an asymmetric transistor cell with a transistor channel formed along one (e.g., only one) of the two longitudinal sidewalls of the gate structure. The formation of the separation regions may be combined with implant processes that define the shielding regions. For example, the separation regions may be formed without additional process acts by modifying one or more implant masks used for the formation of the shielding regions.

According to an embodiment, the silicon carbide device includes a first source region and a second source region. The first source region adjoins (e.g., directly adjoins) a first gate sidewall of the gate structure. Opposite (e.g., directly opposite) of the first source region, the second source region may adjoin (e.g., directly adjoin) a second gate sidewall of the gate structure, which second gate sidewall is opposite to the first gate sidewall. For example, the transistor cell may be a symmetric transistor cell with transistor channels formed along both longitudinal sidewalls of the gate structure. Providing transistor channels at both sides of the gate structures may increase overall channel width without increasing the chip area.

According to an embodiment, the silicon carbide device includes a plurality of parallel gate structures and the cathode region may extend from one gate structure to a neighboring gate structure. The complete width of a SiC mesa between two neighboring gate structures can be used as Schottky contact such that area efficiency is high.

According to an embodiment, the silicon carbide device includes a plurality of parallel gate structures. A spacing region of the second conductivity type may be formed between one of the gate structures and the cathode region. The spacing region may improve the shielding of the Schottky contact. The spacing region may also improve the shielding of the bottom of the trench gate structure, in addition to a shielding structure. For example, the spacing region may extend at least as deep or even deeper (e.g. slightly deeper) into the silicon carbide body than the trench gate structure.

According to an embodiment, the silicon carbide device includes a plurality of parallel gate structures and spacing regions of the second conductivity type may be formed between the cathode region and two of the gate structures. The spacing regions may allow shielding of the Schottky contact on all lateral sides.

According to an embodiment, the cathode region may include a lower cathode portion and an upper cathode portion between the lower cathode portion and the first surface. A maximum first width of the upper cathode portion orthogonal to the first direction (and orthogonal to the vertical direction) is smaller than a maximum second width of the lower cathode portion orthogonal to the first direction (and orthogonal to the vertical direction). The resulting JFET structure with a broadened portion at a distance to the first surface may further improve the shielding of the Schottky contact.

In an alternative embodiment, the shielding may be improved by means of a narrowed lower cathode portion. In such an embodiment, a maximum first width of the upper cathode portion orthogonal to the first direction (and orthogonal to the vertical direction) is greater than a maximum second width of the lower cathode portion orthogonal to the first direction (and orthogonal to the vertical direction).

According to an embodiment, a plurality of cathode regions and a plurality of source regions are arranged between the gate structures, for example between two neighboring gate structures. The cathode regions may be arranged and/or may extend along the first direction and the source regions may be arranged and/or may extend along a second direction orthogonal to the first direction (and orthogonal to the vertical direction). This way, the cathode regions and the separation regions may be formed by comparatively simple modifications of implant masks.

According to an embodiment, the cathode regions and the source regions may alternate along the second direction (i.e. along lines extending orthogonal to the first direction).

The Schottky contacts and the transistor cells may thus be arranged in a checkered manner, with the transistor cells corresponding to the "white fields" and the Schottky contacts corresponding to the "black fields" of a checkerboard. Both the unipolar Schottky current and the bipolar transistor current may thus distribute more uniformly across the lateral cross-sectional area of the silicon carbide body.

Figure 1B:
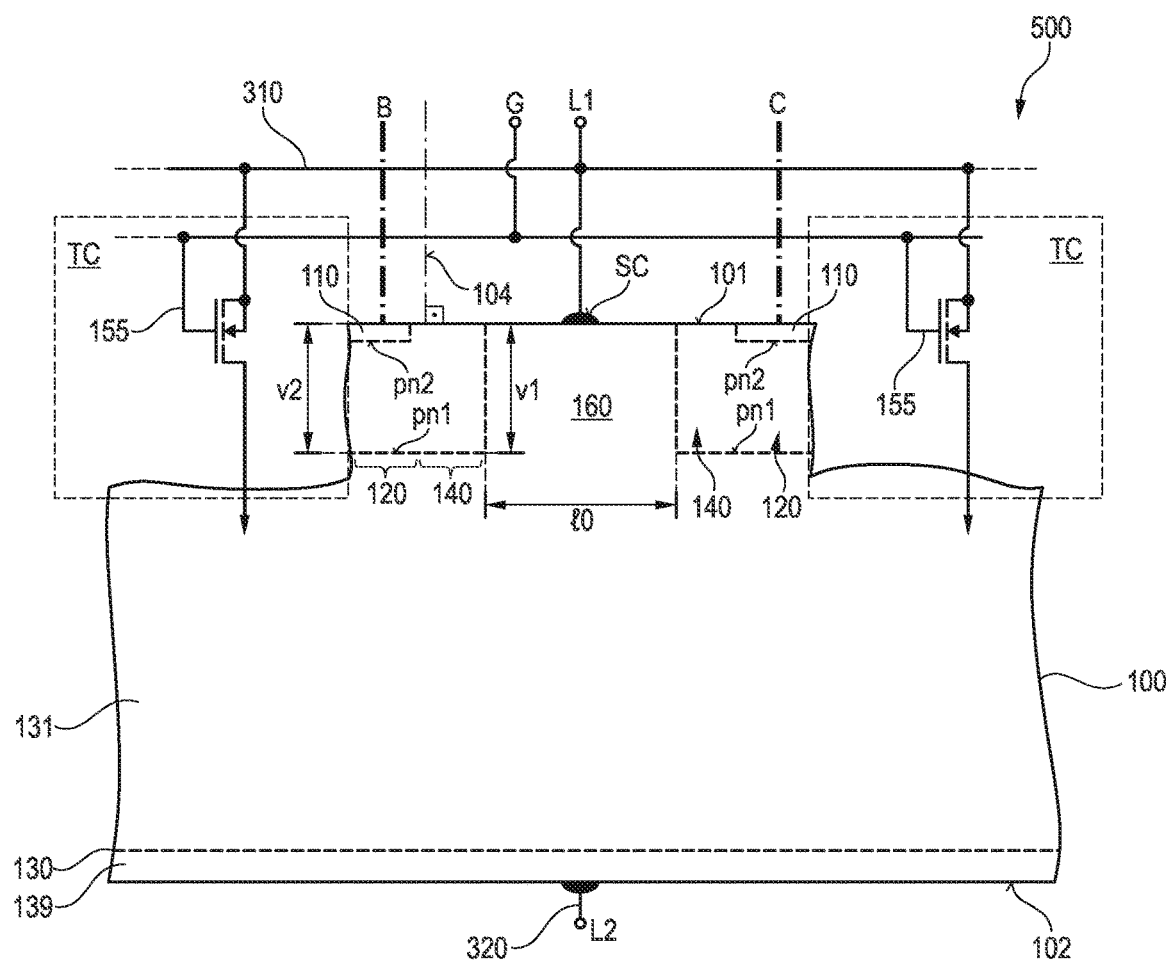

FIGS. 1A and 1B show a portion of a semiconductor device 500 with a silicon carbide body 100. The semiconductor device 500 may be or may include an IGFET (insulated gate field effect transistor), for example an MOSFET (metal oxide semiconductor FET), an MCD (MOS controlled diode) or an IGBT (insulated gate bipolar transistor), by way of example.

The silicon carbide body 100 may include or consist of single crystalline silicon carbide, e.g., a silicon carbide crystal including the main constituents silicon and carbon. The silicon carbide crystal may include unwanted impurities like hydrogen, and/or oxygen and/or intended impurities, e.g., dopant atoms. The polytype of the silicon carbide crystal may be 15R or may be a hexagonal polytype, e.g. 2H, 6H, or 4H. The silicon carbide body 100 may include or consist of a silicon carbide layer grown by epitaxy.

The silicon carbide semiconductor body may have an off-direction, for example in a <11-20> or a <1-100> direction. A first surface 101 at a front side of the silicon carbide body 100 may be planar or ripped. A surface normal 104 orthogonal to a planar first surface 101 or orthogonal to a mean plane of a ripped first surface 101 defines a vertical direction. Directions orthogonal to the surface normal 104 are lateral directions (e.g., the first and the second direction). The surface normal 104 may coincide with a main lattice direction or may be tilted to a main lattice direction by an off-axis angle, wherein the off-axis angle may be in a range from 2° to 8°, for example 4°. At the rear side of the silicon carbide body 100, a second surface 102 may extend parallel to a planar first surface 101 or parallel to a mean plane of a ripped first surface 101.

At least two transistor cells TC and a Schottky contact SC are formed at the front side of the silicon carbide body 100, wherein along a lateral first direction 291 each Schottky contact SC is formed between two transistor cells TC. A drift structure 130 laterally extends through the silicon carbide body 100 between the transistor cells TC and the second surface 102.

The drift structure 130 includes a drift zone 131 of a first conductivity type. The drift zone 131 forms a voltage sustaining structure, wherein a vertical extension and a dopant concentration in the drift zone 131 may be selected such that the semiconductor device 500 provides a nominal blocking voltage capability in an off state of the semiconductor device 500. The drift zone 131 may be formed in a layer grown by epitaxy. A mean net dopant concentration in the drift zone 131 may be, for example, in a range from $1E15$ $cm^{-3}$ to $5E16$ $cm^{-3}$.

A heavily doped contact portion 139 may be formed between the drift structure 130 and a second load electrode 320 that adjoins (e.g., directly adjoins) the second surface 102, wherein the heavily doped contact portion 139 forms a low-resistive ohmic contact with the second load electrode 320. The contact portion 139 may have the same conductivity type as the drift zone 131, the opposite conductivity type, or may include zones of both conductivity types.

Each transistor cell TC includes a source region 110 and a body region 120, wherein the body region 120 and the drift structure 130 form a first pn junction pn1 and wherein the body region 120 and the source region 110 form a second pn junction pn2. A gate structure 150 extends along the first direction 291 and is in contact with the source regions 110 and in contact with the body regions 120 of the transistor cells TC.

Cathode regions 160 are located between the source regions 110 along the lateral first direction 291. The cathode regions 160 and the drift structure 130 may form unipolar junctions. A length l0 of the cathode region 160 along the first direction 291 may be in a range from a few 100 nanometers (nm) (e.g., 100 nm, 200 nm, 300 nm, 400 nm, 500 nm, etc.) up to almost an entire length of the trench gate structure along a longitudinal extent of the trench gate structure (e.g., the length l0 of the cathode region 160 may be less than the entire length by a difference and/or the difference may be less than a threshold difference). For example, a length of the cathode region 160 is at least 0.5 micrometers (μm), e.g. at least 1 μm or at least 2 μm, and/or at most 5 μm, for example at most 2 μm.

Separation regions 140 of the second conductivity type separate the source regions 110 and the cathode regions 160 along the first direction 291. A first vertical extension v1 of the separation regions 140 may be in a range from a few ten nanometers, for example at least 100 nm, to several micrometers (e.g., 10 μm and/or a different length). The first vertical extension v1 may be equal to a maximum vertical distance v2 between the first pn junction pn1 and the first surface 101, smaller than the maximum vertical distance v2 or greater than the maximum vertical distance v2.

The source regions 110 and the body regions 120 of the transistor cells TC may be electrically connected or coupled to a first load electrode 310, which may form or which may be electrically connected or coupled to a first load terminal L1. The cathode regions 160 and the first load electrode 310 form Schottky contacts SC.

The second load electrode 320 may form or may be electrically connected or coupled to a second load terminal L2. Gate electrodes 155 of the transistor cell TC may be electrically connected or coupled to a gate terminal G. The first load terminal L1 may be an anode terminal of an MCD, a source terminal of an IGFET or an emitter terminal of an IGBT. The second load terminal L2 may be a cathode terminal of an MCD, a drain terminal of an IGFET or a collector terminal of an IGBT, by way of example.

The transistor cells TC may be n-channel FET cells with p-doped body regions 120, n-doped source regions 110 and n-doped drift zone 131. Alternatively and/or additionally, the transistor cells TC are p-channel FET cells with n-doped body regions 120, p-doped source regions 110 and p-doped drift zone 130. As a mere example, the following description refers to n-channel FET cells.

Figure 2A:
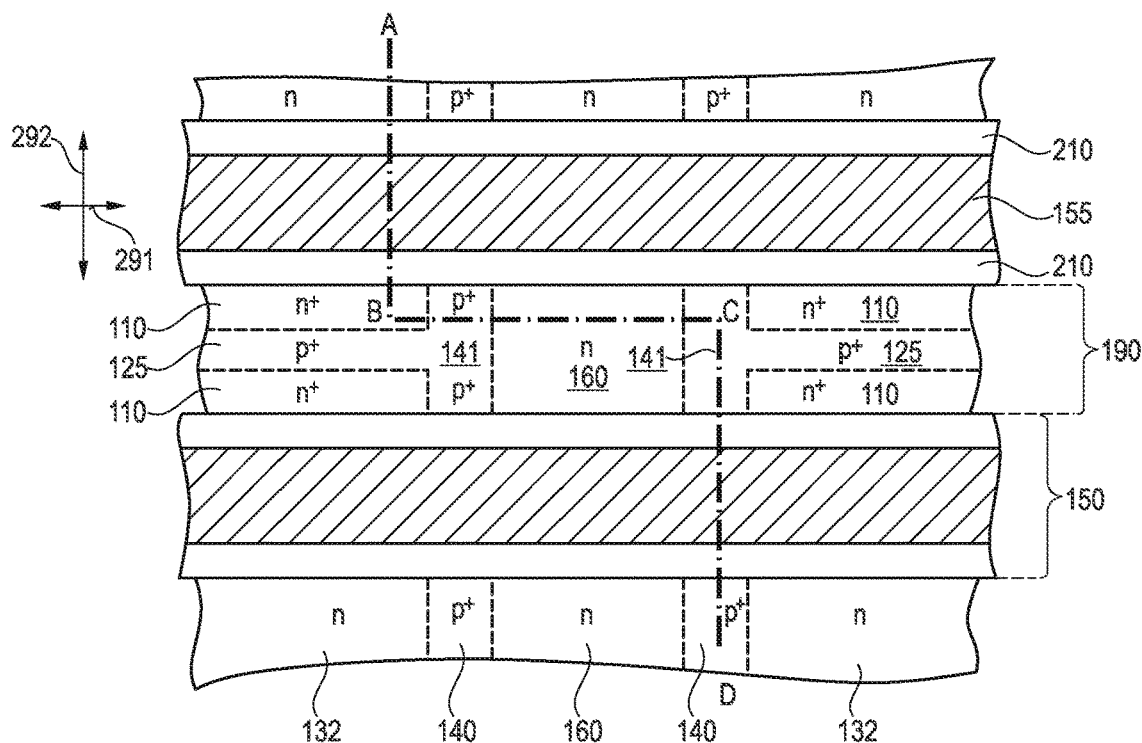
FIGS. 2A-2B illustrate schematic plan and vertical cross-sectional views of a portion of a silicon carbide device according to an embodiment with planar gate structures.
Figure 2B:
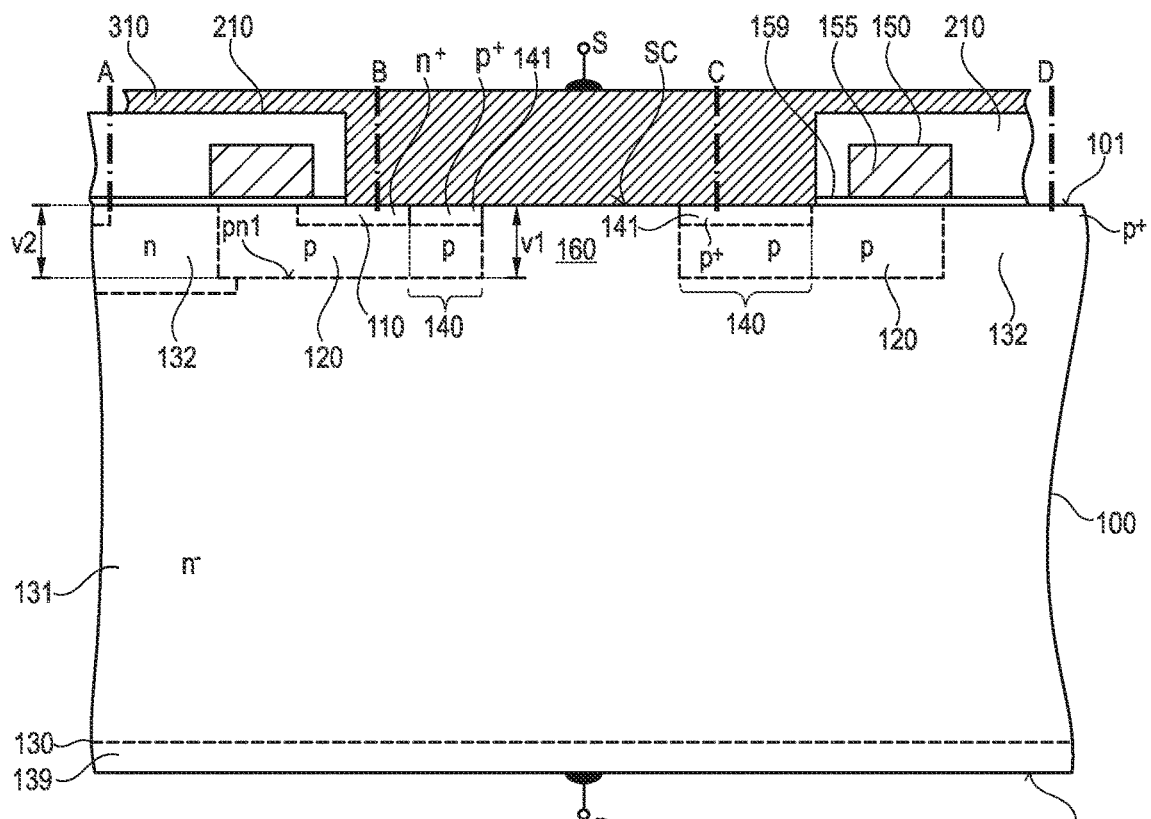

FIGS. 2A and 2B show planar gate structures 150 including conductive gate electrodes 155 formed on the first surface 101. A gate dielectric 159 separates the gate electrode 150 from the silicon carbide body 100. The transistor cells TC may be arranged in pairs, wherein the transistor cells TC of each pair may be formed mirror-inverted with regard to a vertical symmetry plane orthogonal to the cross-sectional planes of FIGS. 2A and 2B.

An interlayer dielectric 210 may separate the gate electrode 155 and the first load electrode 310. The interlayer dielectric 210 may further separate the first load electrode 310 and a drain portion 132 of the drift structure 130, wherein the drain portion 132 is formed between the drift zone 131 and the first surface 101. In the on-state of the transistor cells TC, inversion channels form in the silicon carbide body 100 along the first surface 101 opposite to the gate electrode 155 between the source region 110 and the drain portion 132. Between the source regions 110 of neighboring pairs of transistor cells TC, the body regions 120 may include heavily doped body contact portions 125 adjoining (e.g., directly adjoining) the first surface.

The separation regions 140 may be formed as lateral extensions of the body regions 120 along the first direction 291. The separation regions 140 may include heavily doped separation contact portions 141 that may be formed as lateral extensions of the body contact portions 125.

Figure 3A:
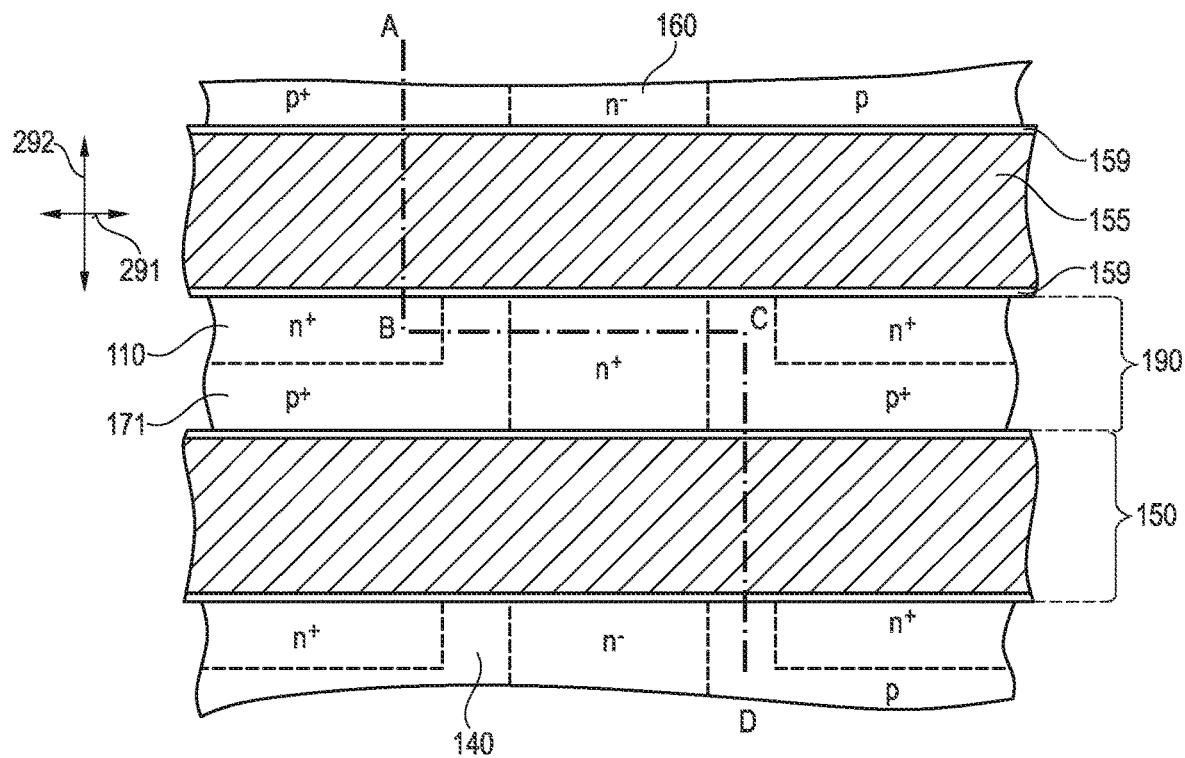
FIGS. 3A-3B illustrate schematic plan and vertical cross-sectional views of a portion of a silicon carbide device according to an embodiment with trench gate structures and shallow separation regions.
Figure 3B:
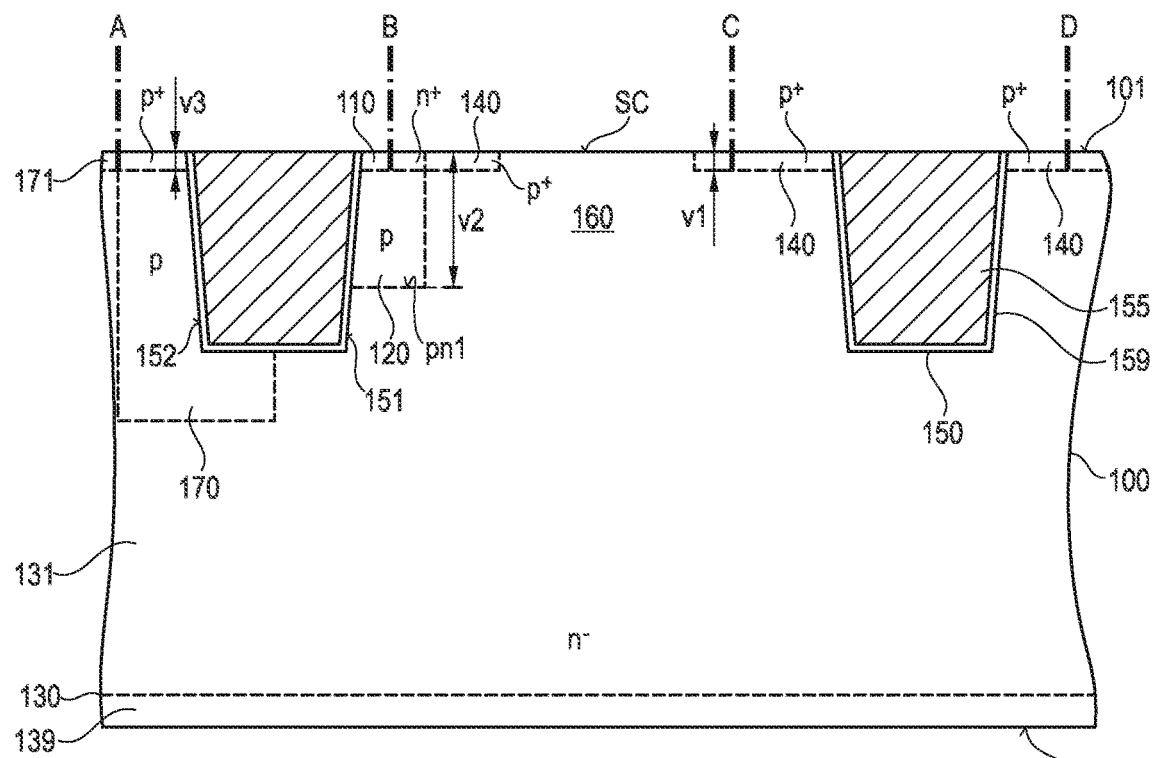
Figure 4A:
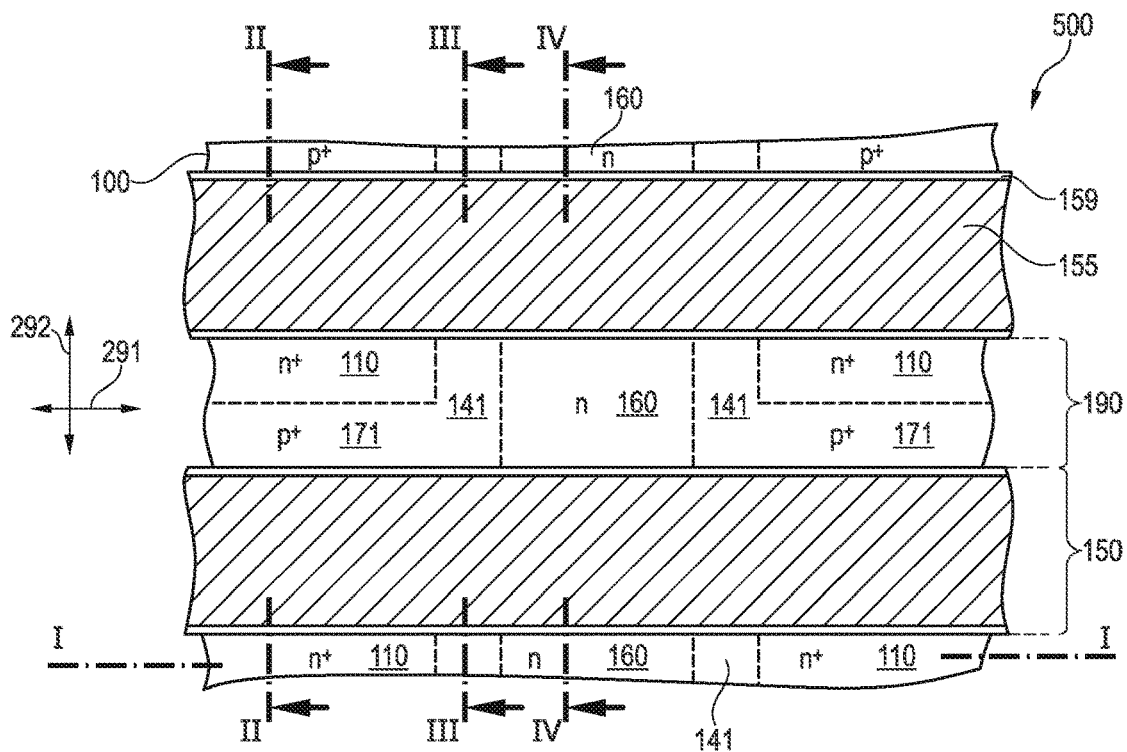
FIGS. 4A-4E illustrate schematic plan and vertical cross-sectional views of a portion of a silicon carbide device according to an embodiment with deep shielding and separation regions.
Figure 4B:
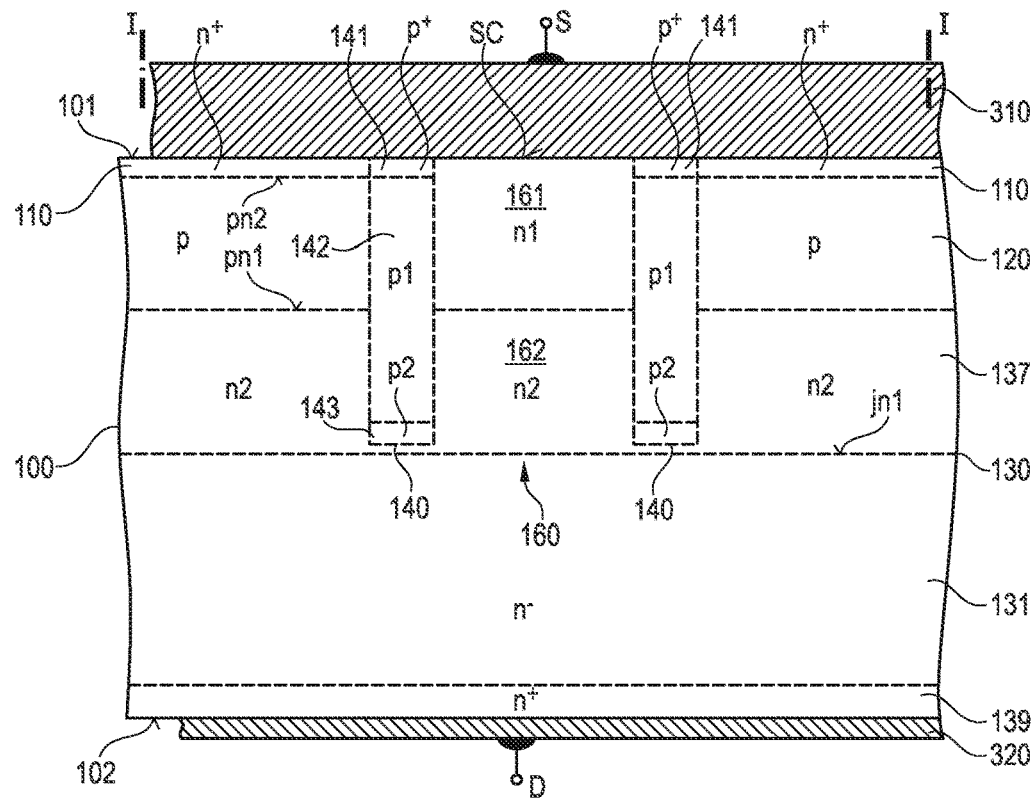
Figure 4C:
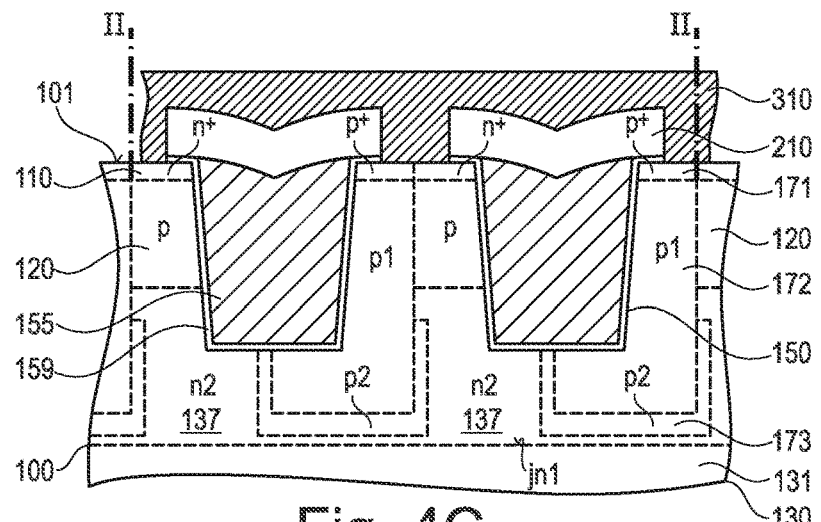
Figure 4D:
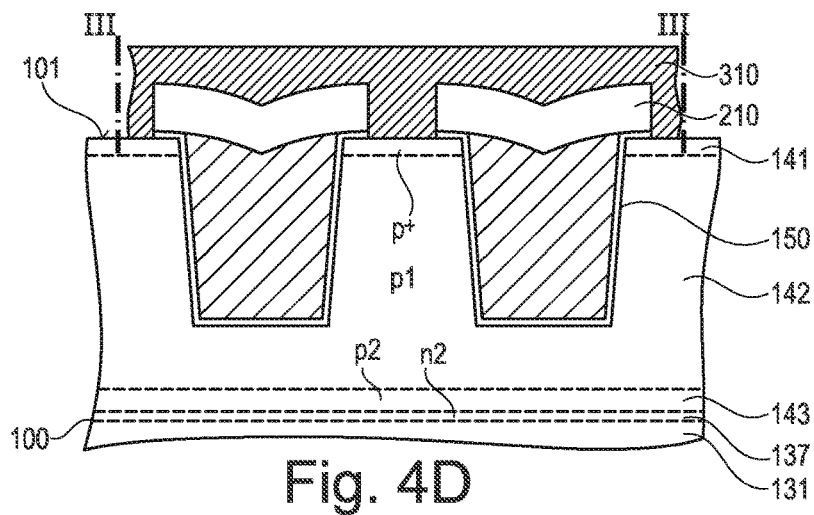
Figure 4E:
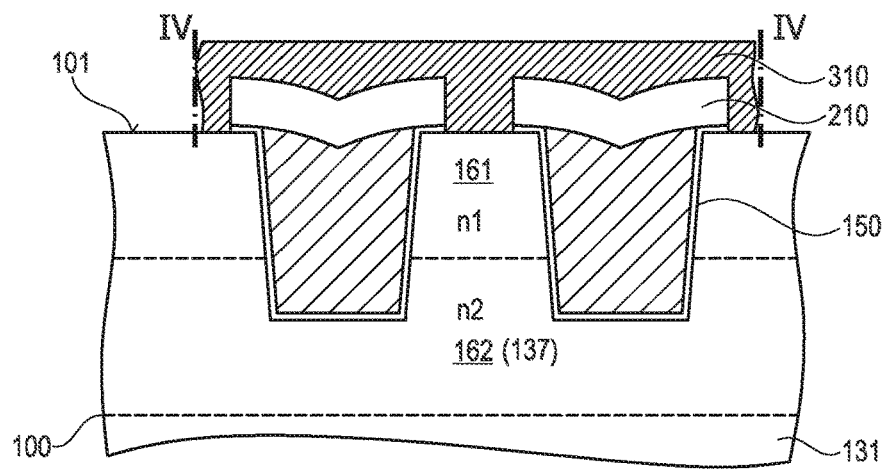

FIGS. 3A and 3B show trench gate structures 150 extending from the first surface 101 into the silicon carbide body 100. The source regions 110 and the body regions 120 are in contact with first gate sidewalls 151 of the trench gate structures 150.

Shielding regions 170 may be in contact with opposite second gate sidewalls 152 of the trench gate structures 150 and may also be formed along a portion of a bottom surface of the trench gate structures 150. In the shielding regions 170 a maximum dopant concentration may be higher than in the body regions 120. The dopant concentration in the shielding region 170 may be sufficiently high such that no inversion layer is formed along the second trench sidewalls 152 at least as long as the semiconductor device 500 operates within the SOA. The shielding regions 170 are separated from the first trench sidewalls 151. For example, the source regions 110 and the body regions 120 may be located between the shielding regions 170 and the first trench sidewalls 151 of the gate structures 150. The shielding regions 170 may include heavily doped shielding contact portions 171 along the first surface 101, wherein the first load electrode 310 and the heavily doped shielding contact portions 171 may form ohmic contacts. A vertical extension v1 of the separation region 140 may be equal to a vertical extension v3 of the shielding contact portions 171.

In FIGS. 4A-4E each shielding region 170 includes a shielding contact portion 171, a shielding connection portion 172 and a shielding bottom portion 173. The shielding bottom portion 173 may adjoin (e.g., directly adjoin) the drift structure 130 and a maximum dopant concentration in the shielding bottom portion 173 may have a greater distance to the first surface 101 than the bottom of the trench gate structure 150. The shielding connection portions 172 connect the shielding bottom portions 173 with the heavily doped shielding contact portions 171.

A maximum dopant concentration in the shielding connection portions 172 is at least ten times as high as a mean dopant concentration in the body regions 120. An interlayer dielectric 210 separates the first load electrode 310 and the gate electrode 155 in the trench gate structures 150.

The drift structure 130 includes current spread regions 137 between the body regions 120 and the drift zone 131. The current spread regions 137 may separate the body regions 120 and the drift zone 131. The current spread regions 137 and the drift zone 131 may form one or more first unipolar junctions jn1. Current spread regions 137 may also be formed between the cathode region 160 and the drift zone 131. A maximum dopant concentration in the current spread regions 137 is at least double, for example, at least ten times as high as, a maximum dopant concentration in the drift zone 131. A maximum dopant concentration in the cathode regions 160 may be equal to, higher than or lower than the maximum dopant concentration in the current spread regions 137.

The separation regions 140 may be formed from the same implants that define the shielding contact portions 171, the shielding connection portions 172 and the shielding bottom portions 173 of the shielding regions 170. For example, the separation regions 140 include separation bottom portions 143 with the same vertical extension, the same distance to the first surface 101, and/or the same dopant concentration as the shielding bottom portions 173 of the shielding regions 170. Separation connection portions 142 may have the same vertical extension, the same distance to the first surface 101, and/or the same dopant concentration as the shielding connection portions 172 of the shielding regions 170.

In addition or in the alternative, separation contact portions 141 may have the same vertical extension and/or the same dopant concentration as the shielding contact portions 171 of the shielding regions 170.

The separation regions or at least portions of the separation regions 140 may form lateral extensions of the shielding regions 170.

The shielding regions 170 and the separation regions 140 may completely result from the same implants. Alternatively and/or additionally, the separation regions 140 and the shielding regions 170 may differ in at least one implant.

Figure 5A:
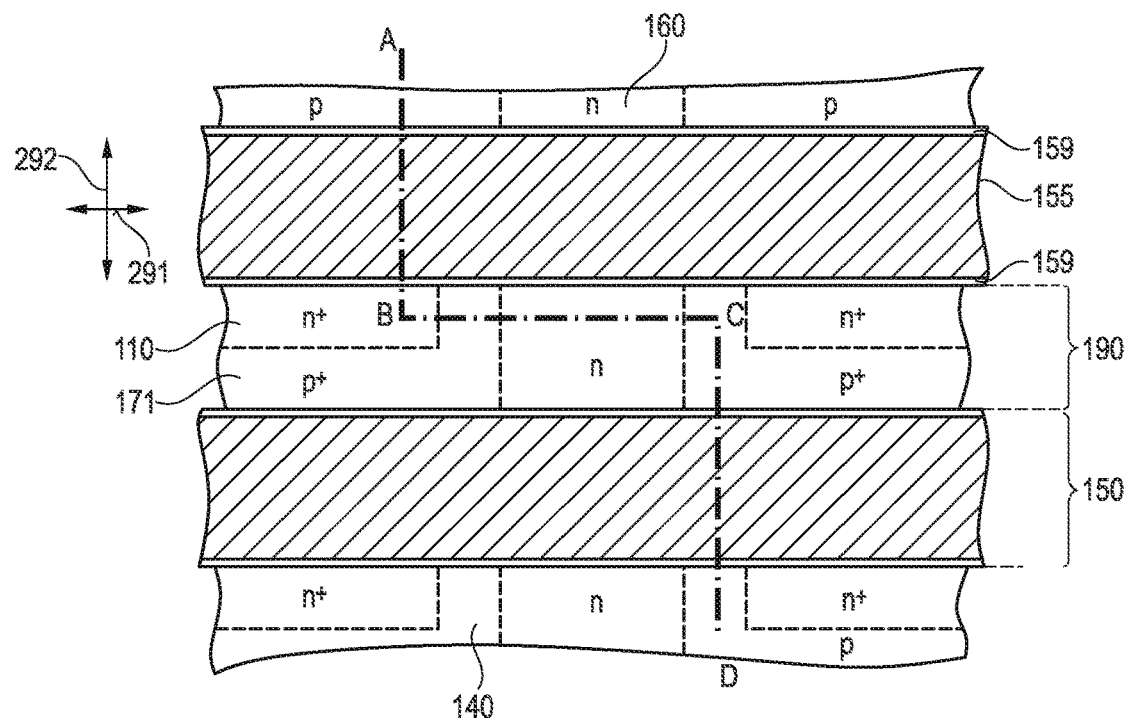
FIGS. 5A-5B illustrate schematic plan and vertical cross-sectional views of a portion of a silicon carbide device according to an embodiment with deep shielding and separation regions.
Figure 5B:
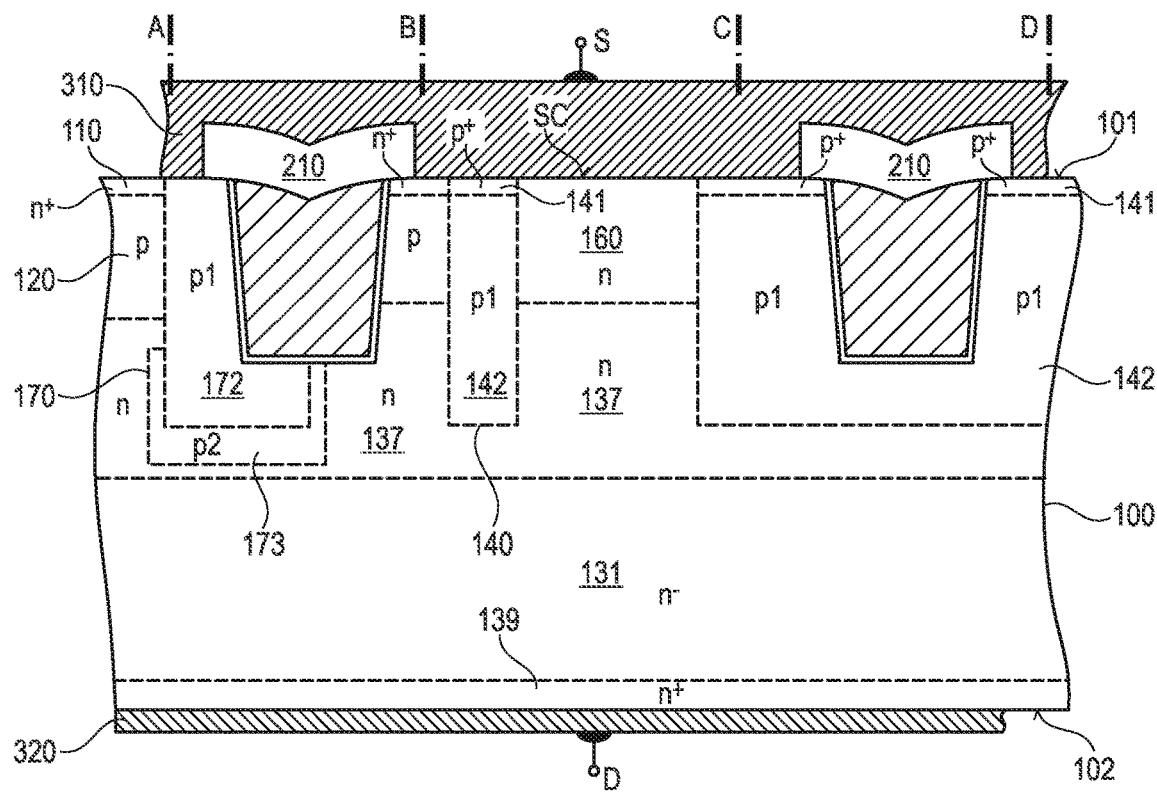

For example, in FIGS. 5A and 5B the separation regions 140 do not include a portion that corresponds to the shielding bottom portion 173. Instead, the separation region 140 includes a separation contact portion 141 corresponding to the shielding contact portion 171 and a separation connection portion 142 corresponding to the shielding connection portion 172 (e.g., the separation region 140 may include only the separation contact portion 141 and the separation connection portion 142).

Figure 6A:
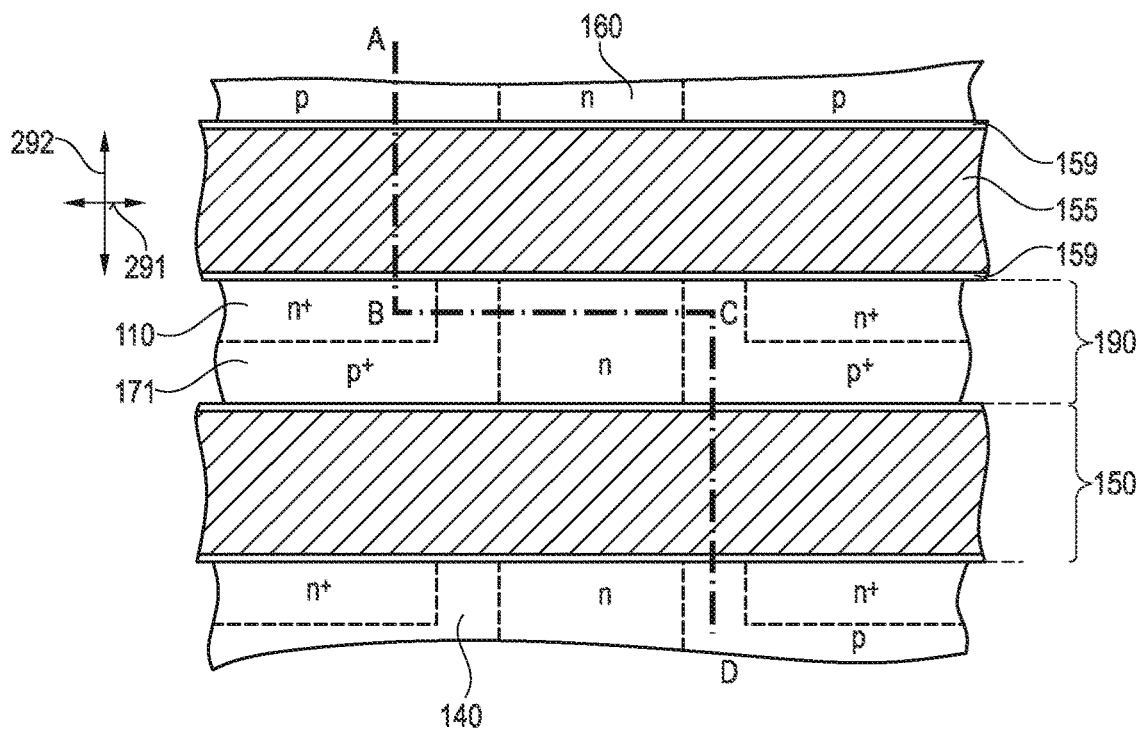
FIGS. 6A-6B illustrate schematic plan and vertical cross-sectional views of a portion of a silicon carbide device according to an embodiment with deep shielding regions and shallow separation regions.
Figure 6B:
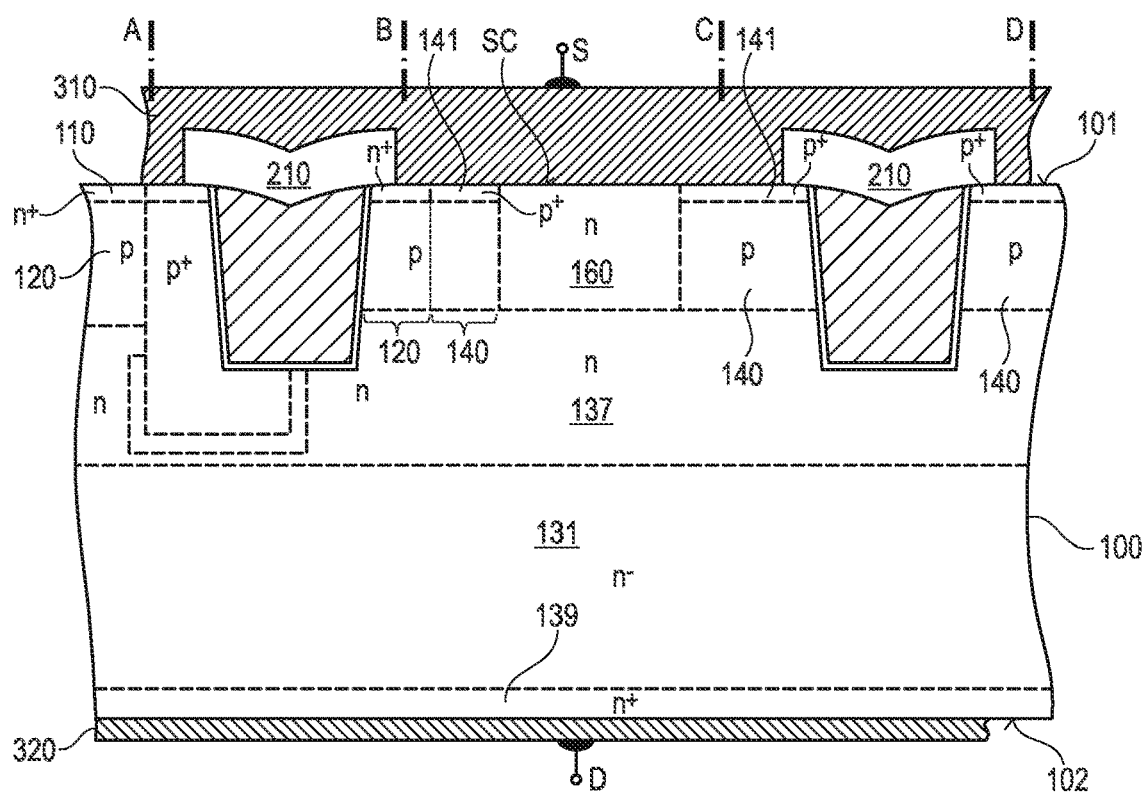

In FIGS. 6A and 6B the separation regions 140 include a separation contact portion 141 that may correspond to the shielding contact portion 171 and a further portion formed by a lateral extension of the body region 120.

Figure 7A:
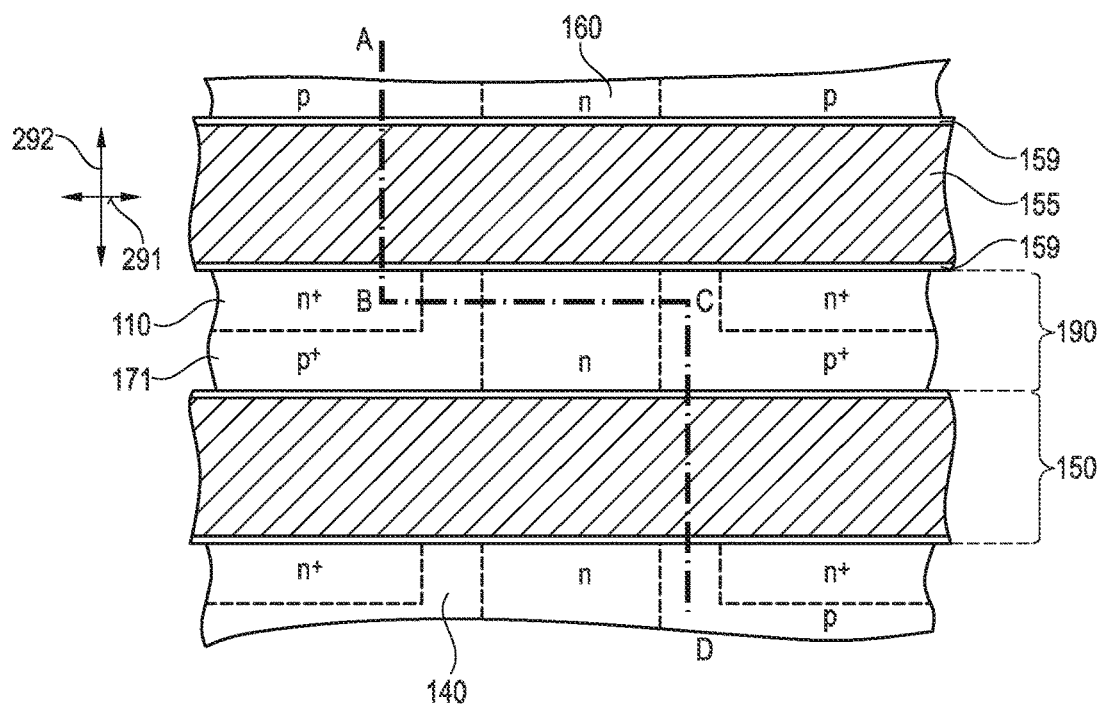
FIGS. 7A-7B illustrate schematic plan and vertical cross-sectional views of a portion of a silicon carbide device according to an embodiment with a cathode region with upper and lower cathode portions.
Figure 7B:
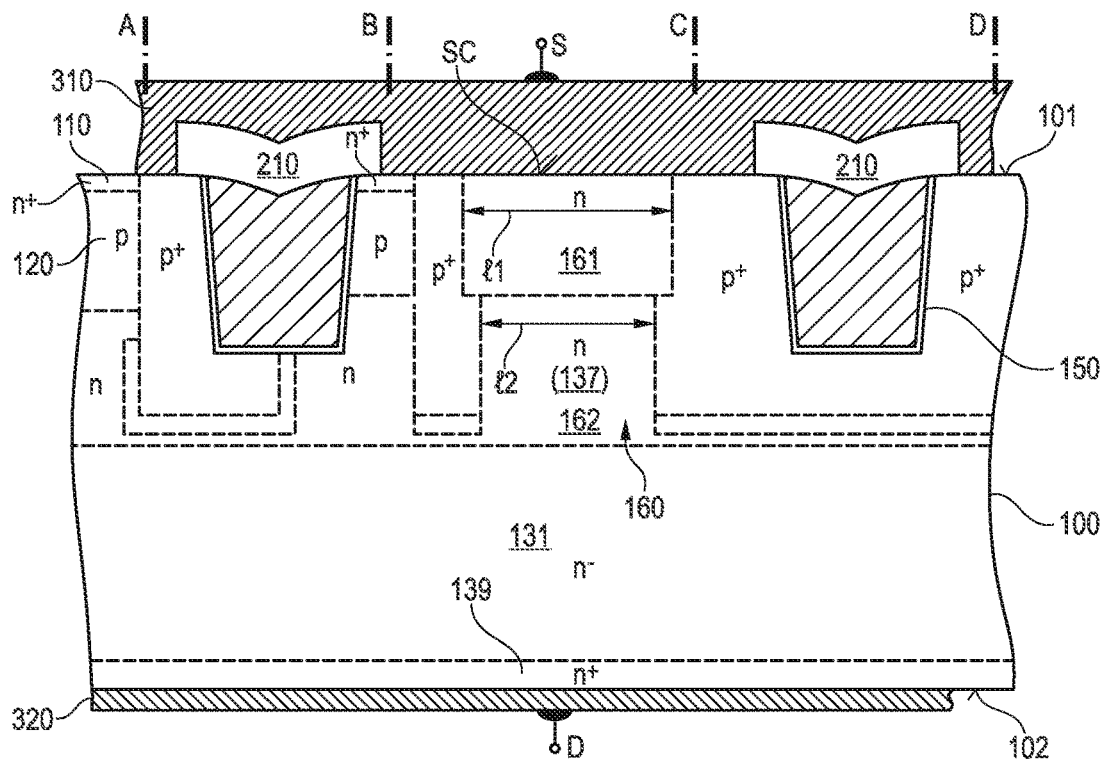

In FIGS. 7A and 7B the cathode region 160 includes a lower cathode portion 162 and an upper cathode portion 161 between the lower cathode portion 162 and the first surface 101. A maximum first length l1 along the first direction 291 in the upper cathode portion 161 may be greater than a maximum second length l2 of the lower cathode portion 162. The lower cathode portion 162 may be formed contemporaneously with the current spread regions 137 by using the same implant processes and/or may have the same vertical dopant profile as the current spread regions 137. A maximum dopant concentration in the upper cathode portion 161 may be equal to or greater than a maximum dopant concentration in the lower cathode portion 162.

Figure 8A:
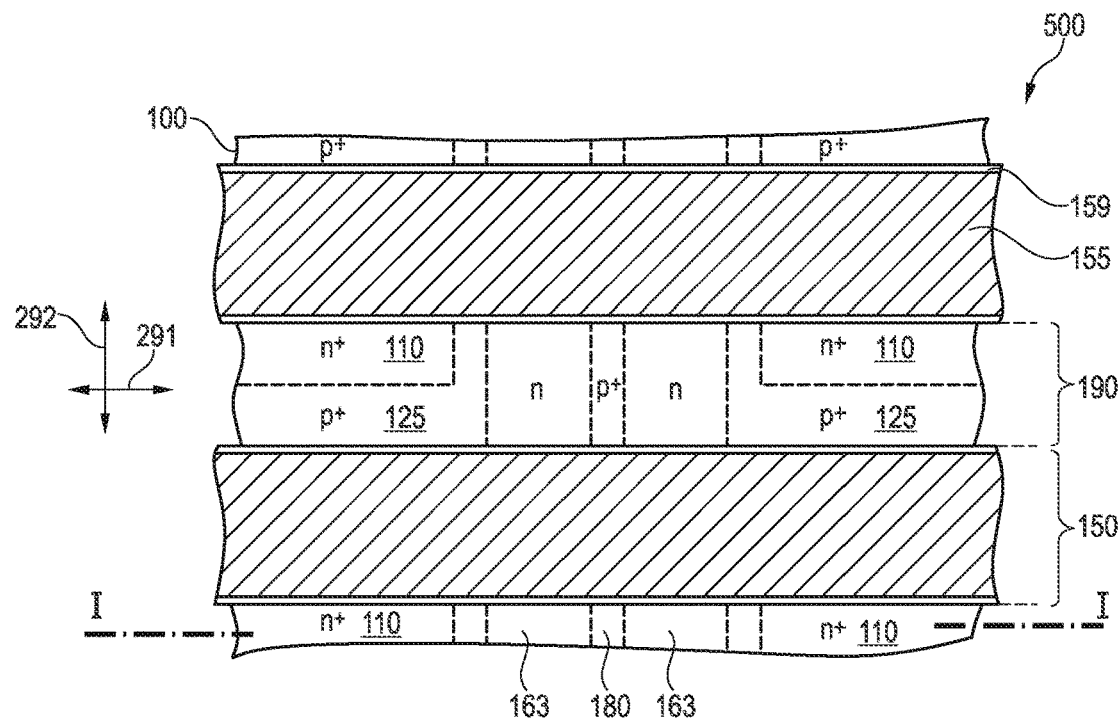
FIGS. 8A-8B illustrate schematic plan and vertical cross-sectional views of a portion of a silicon carbide device according to an embodiment related to dividing regions between lateral cathode portions.
Figure 8B:
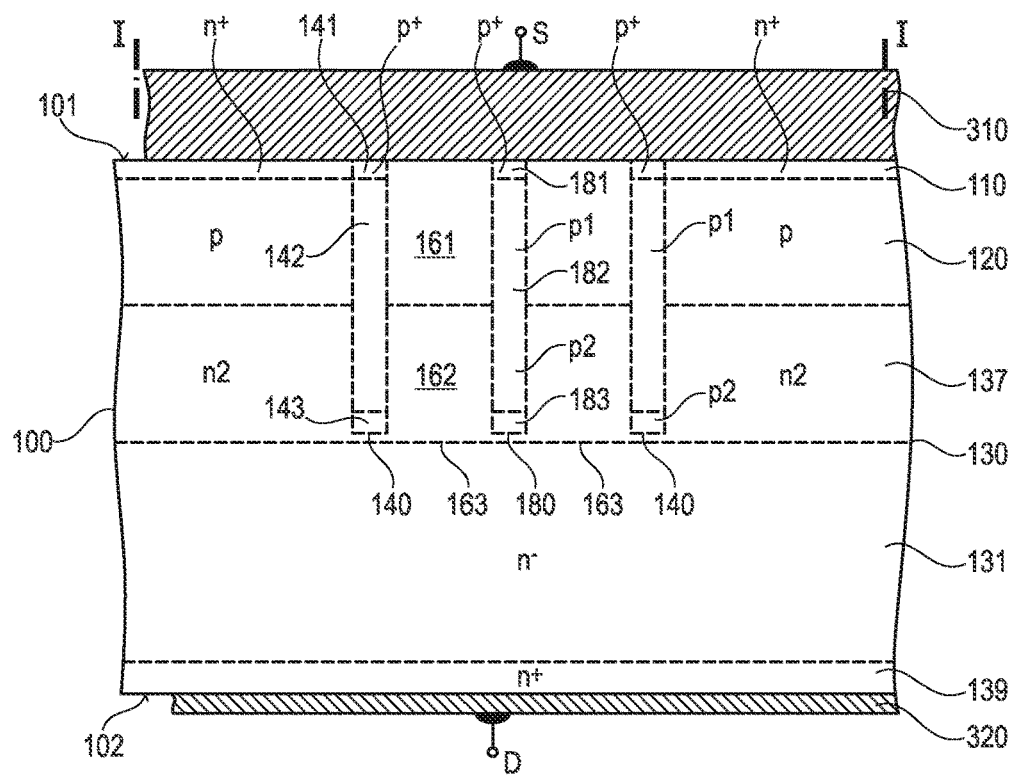

In FIGS. 8A and 8B a dividing region 180 of the conductivity type of the separation regions 140 laterally divides the cathode region 160 along the first direction 291 into two lateral cathode portions 165. The dividing regions 180 may have the same vertical configuration as the separation regions 140 and/or the shielding regions 170 or a different configuration.

For example, the dividing regions 180 may be formed from the same implants that define the separation contact portions 141, the separation connection portions 142 and the separation bottom portions 143 of the separation regions 140. For example, the dividing regions 180 include dividing bottom portions 183 with the same vertical extension, the same distance to the first surface 101 and/or the same dopant concentration as the separation bottom portions 143. Dividing connection portions 182 may have the same vertical extension, the same distance to the first surface 101, and/or the same dopant concentration as the separation connection portions 142. In addition or in the alternative, dividing contact portions 181 may have the same vertical extension and/or the same dopant concentration as the separation contact portions 141. Alternatively and/or additionally, the dividing regions 180 may deviate in at least one implant from the separation regions 140.

FIGS. 8A and 8B show only one single dividing region 180 per cathode region 160. Other embodiments may provide two or more dividing regions 180 separating a cathode region 160 into three or more lateral cathode portions 163.

In FIGS. 9A-9E the cathode regions 160 are in contact with one gate structure 150 and a spacing region 145 separates the cathode region 160 from a second neighboring gate structure 150. The cathode regions 160 may have the same width orthogonal to the first direction 291 as the source regions 110.

Figure 9A:
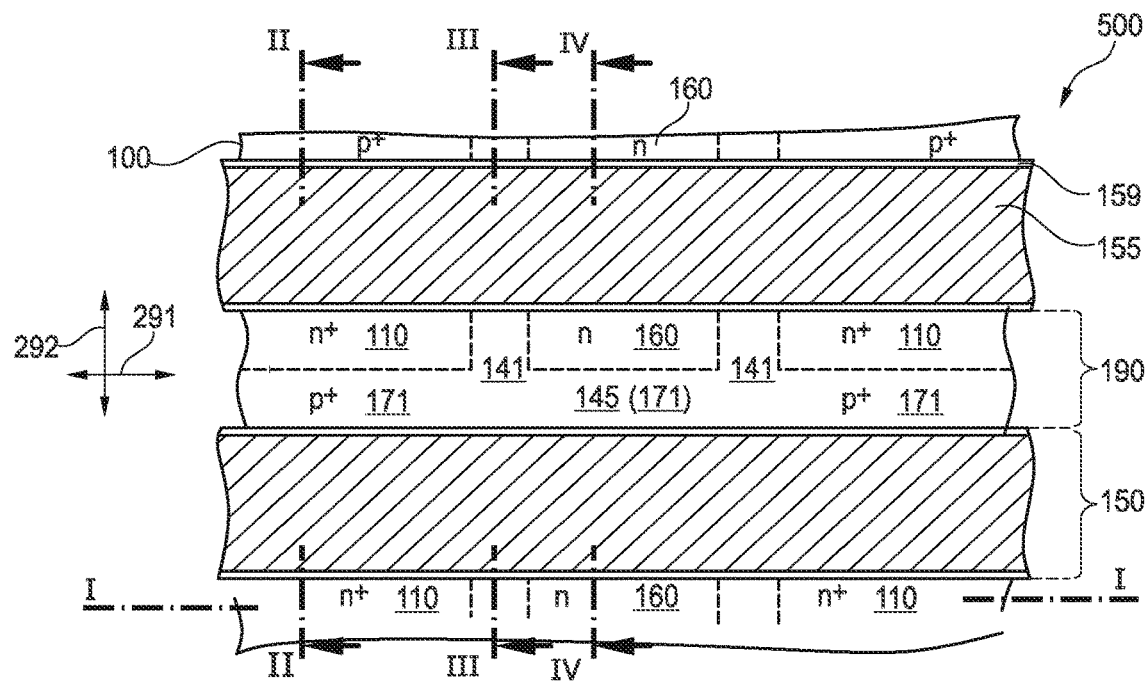
FIGS. 9A-9E illustrate schematic plan and vertical cross-sectional views of a portion of a silicon carbide device according to an embodiment with spacing regions between the cathode region and one of the gate structures.
Figure 9B:
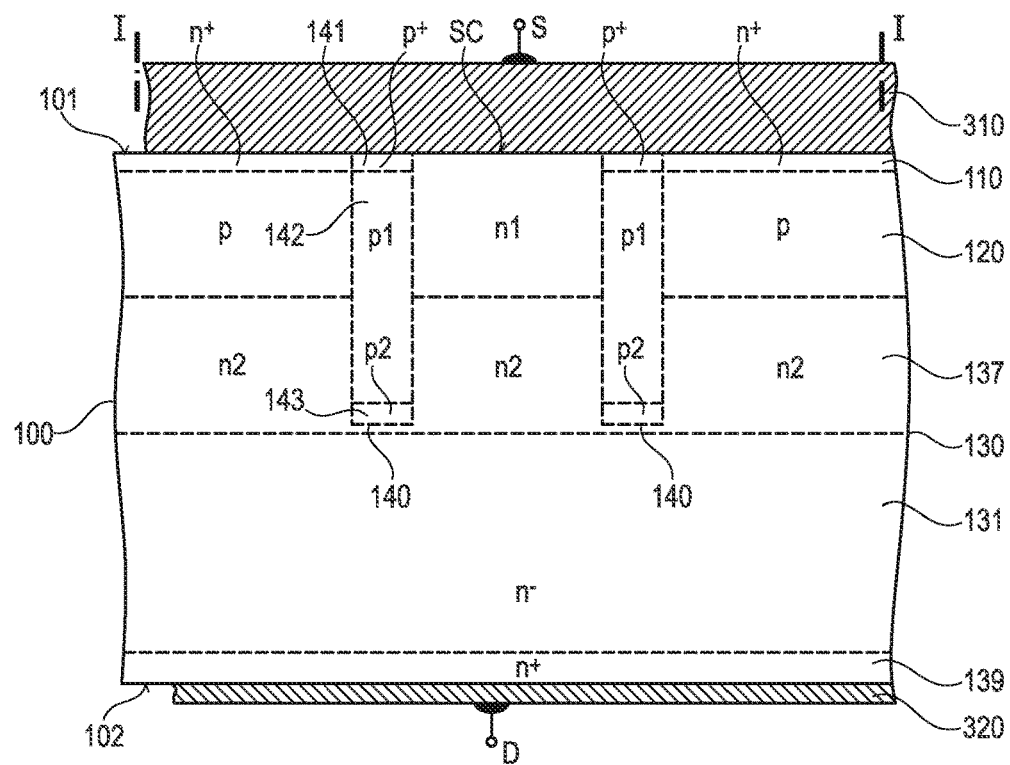
Figure 9C:
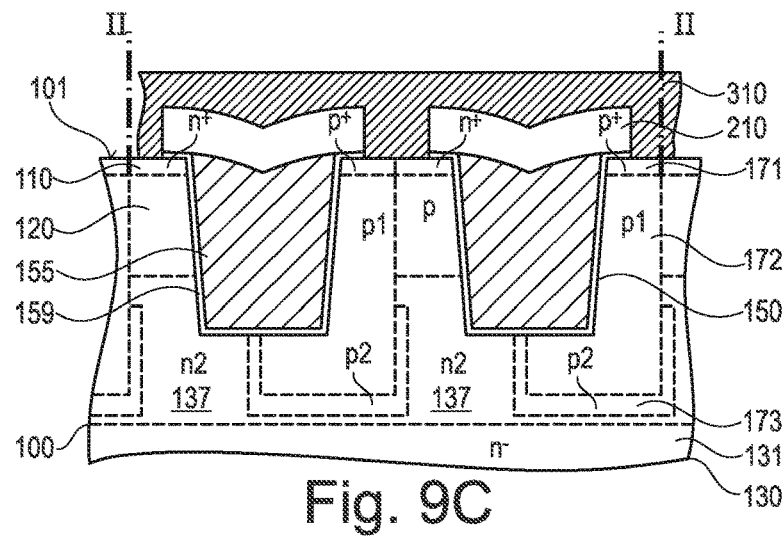
Figure 9D:
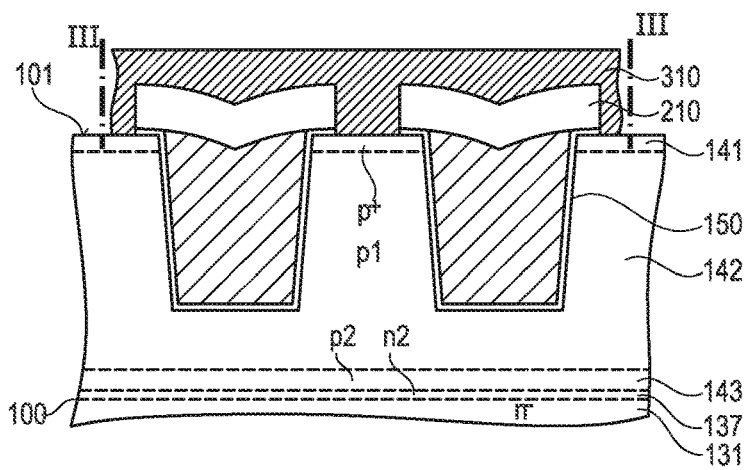
Figure 9E:
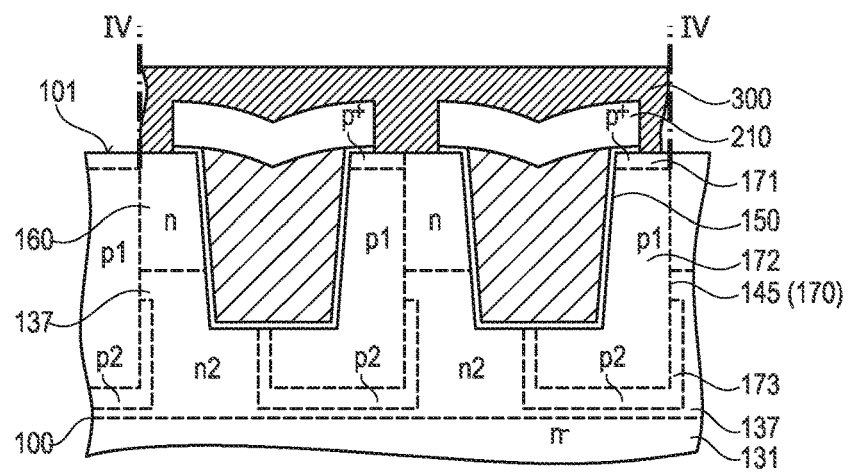
Figure 10A:
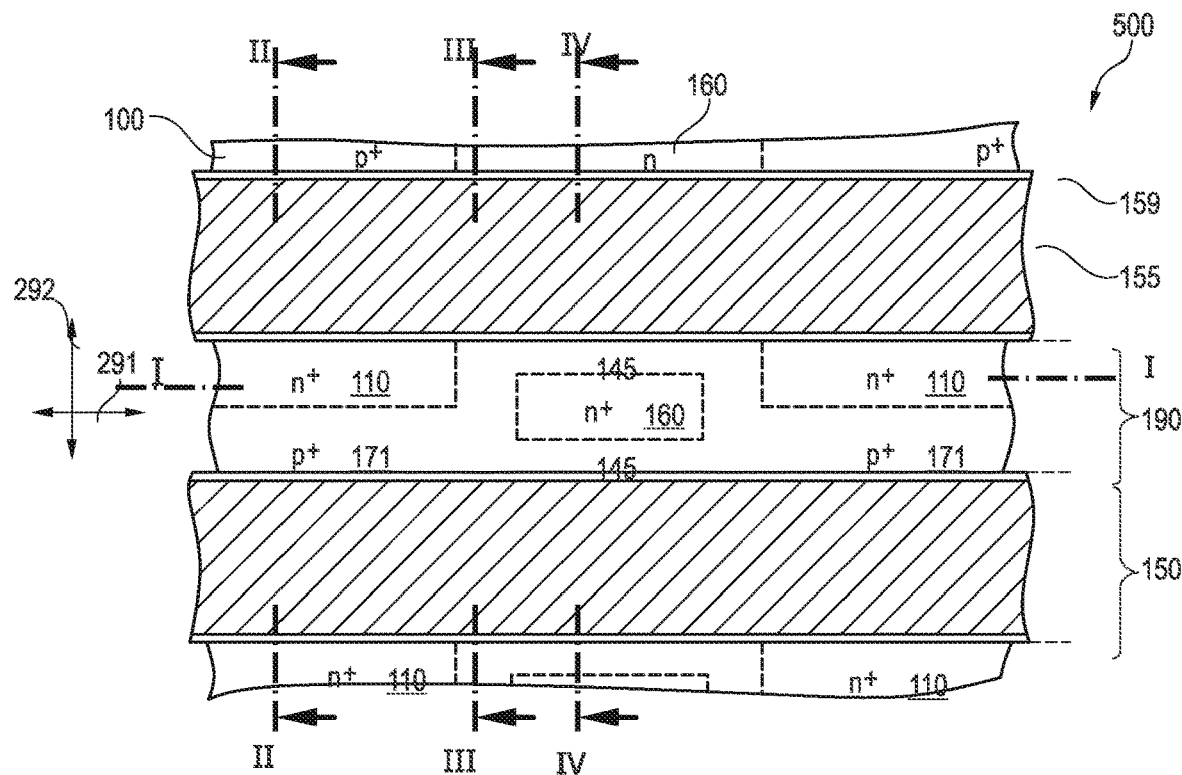
FIGS. 10A-10E illustrate schematic plan and vertical cross-sectional views of a portion of a silicon carbide device according to an embodiment with spacing regions between the cathode region and both neighboring gate structures.
Figure 10B:
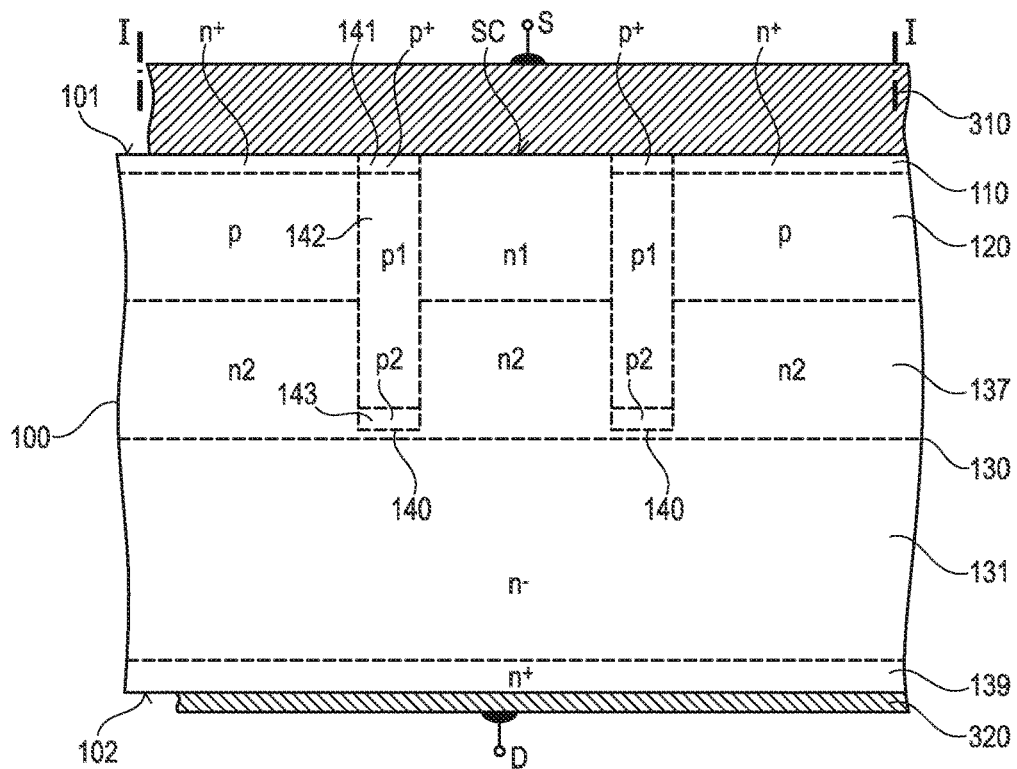
Figure 10C:
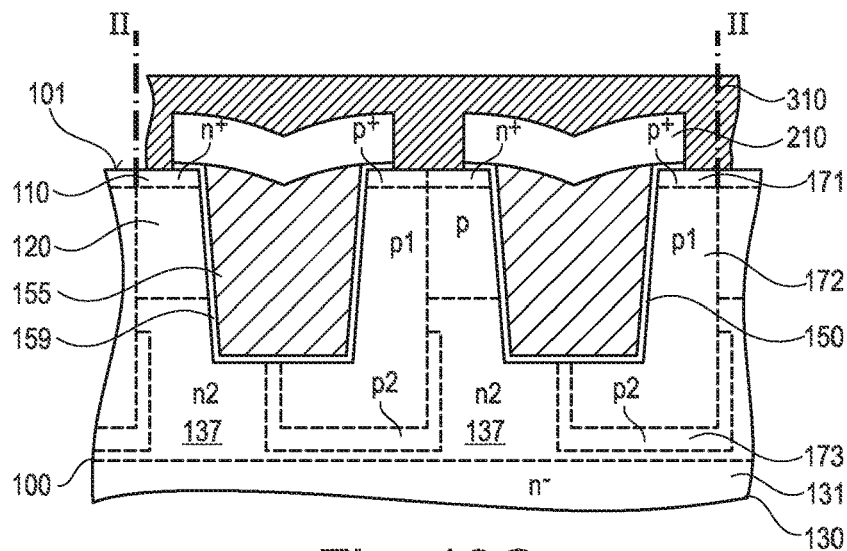
Figure 10D:
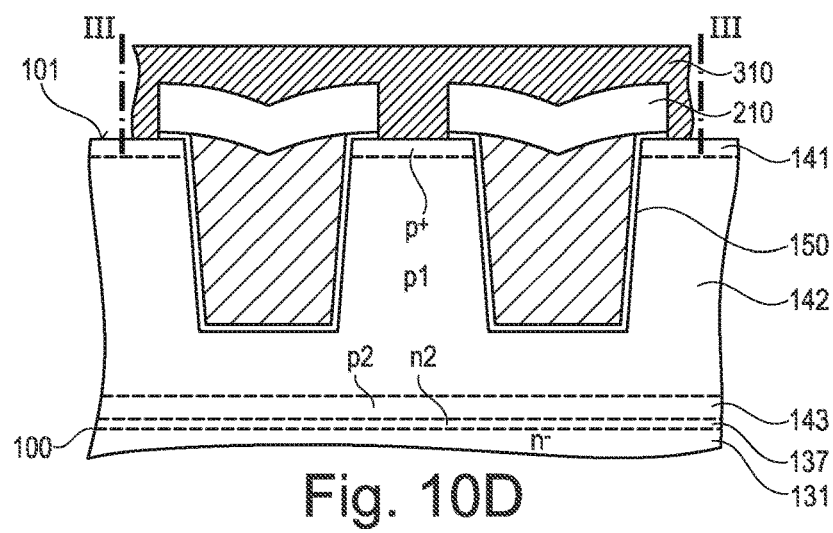
Figure 10E:
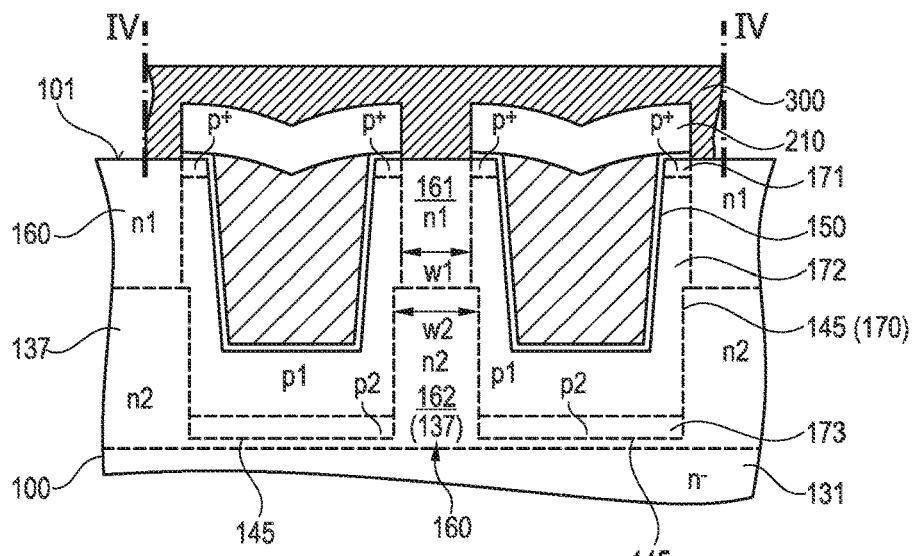
Figure 11A:
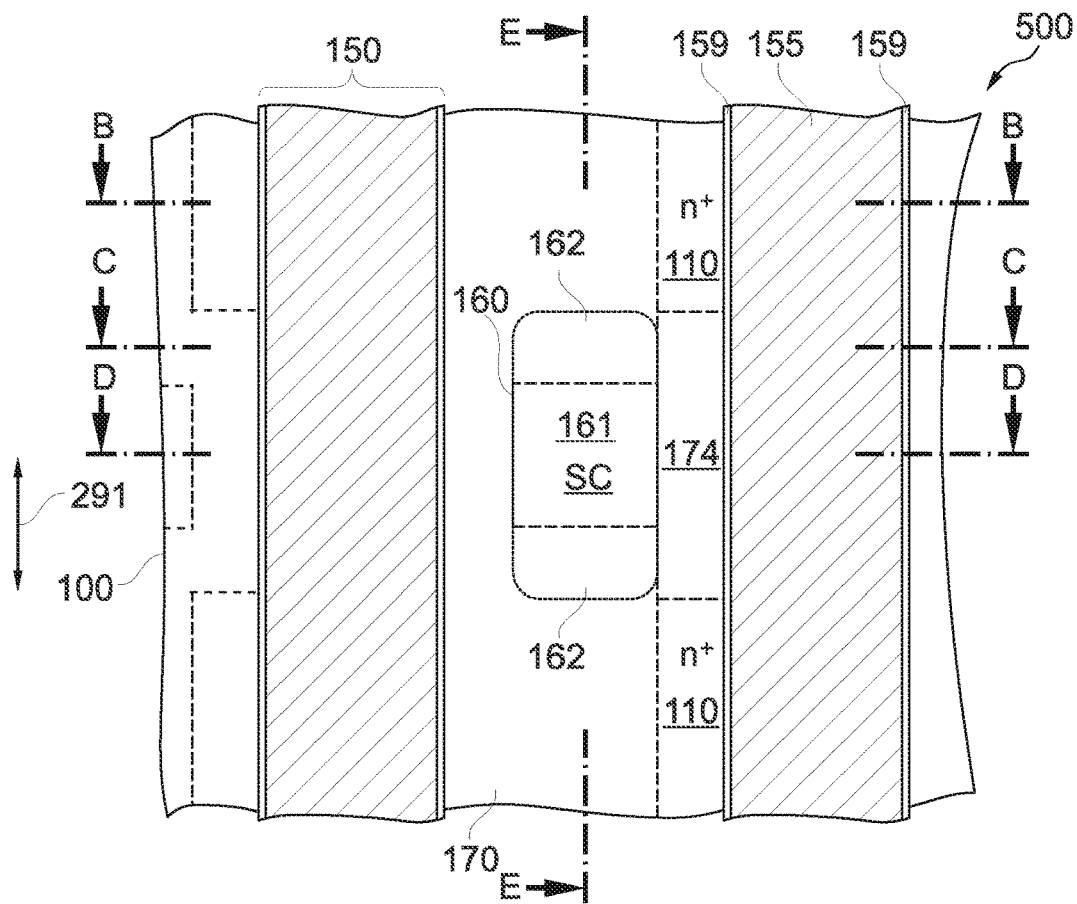
FIGS. 11A-11E illustrate schematic plan and vertical cross-sectional views of a portion of a silicon carbide device with Schottky contacts according to an embodiment with a wide lower cathode portion.
Figure 11B:
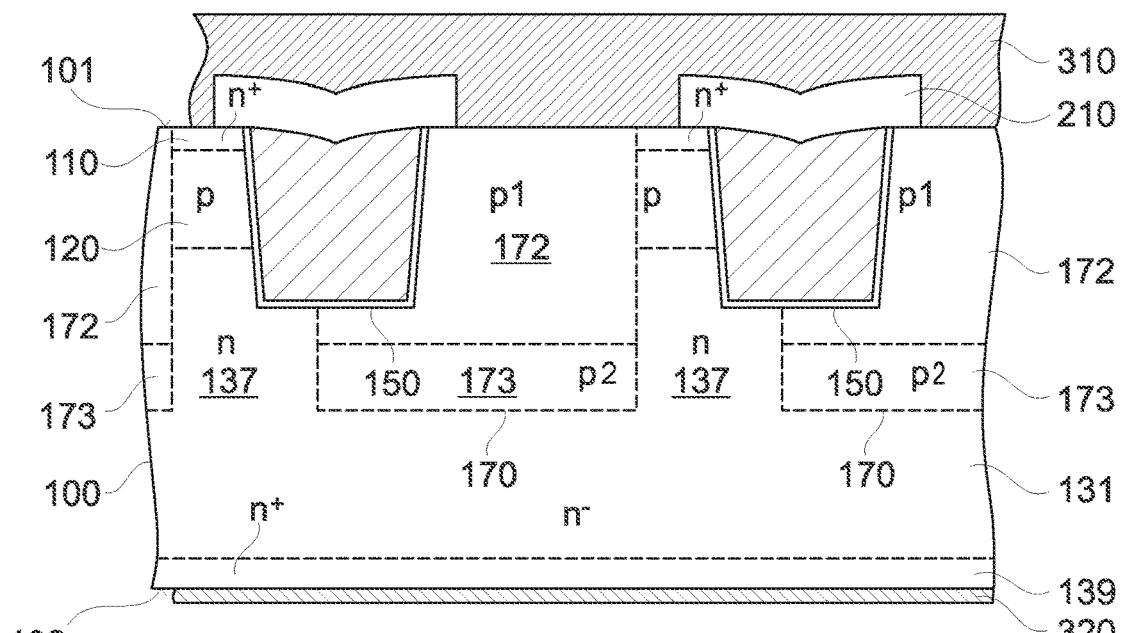
Figure 11C:
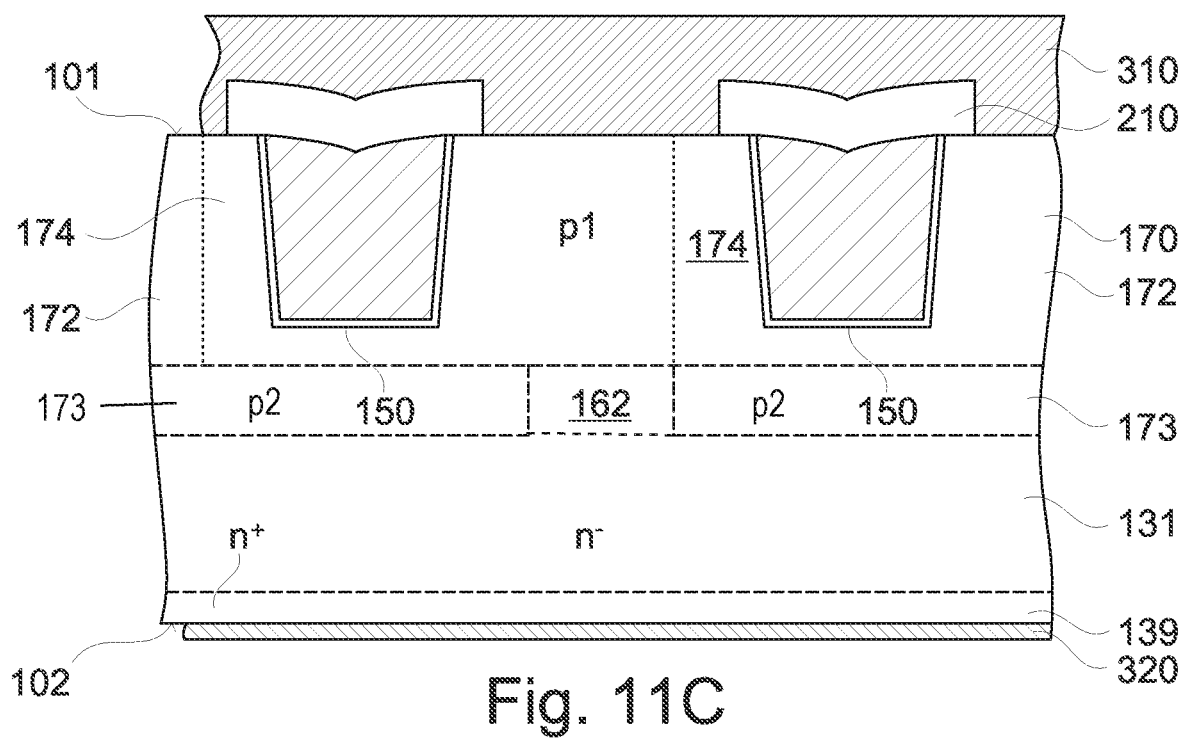
Figure 11D:
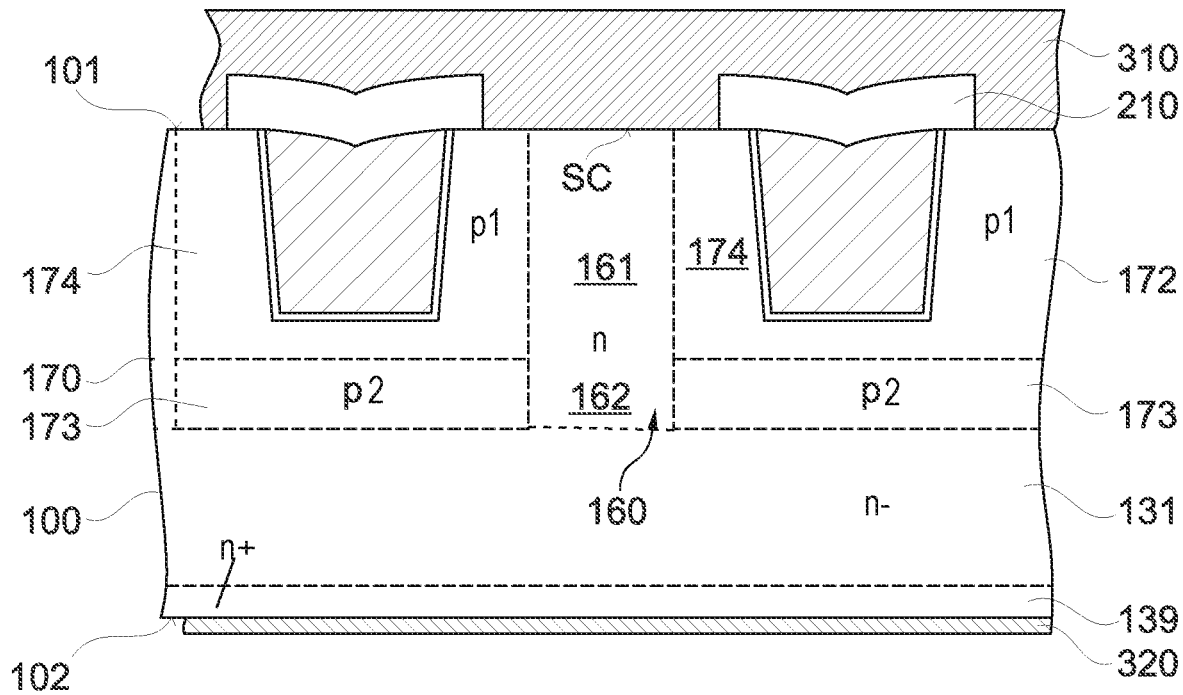
Figure 11E:
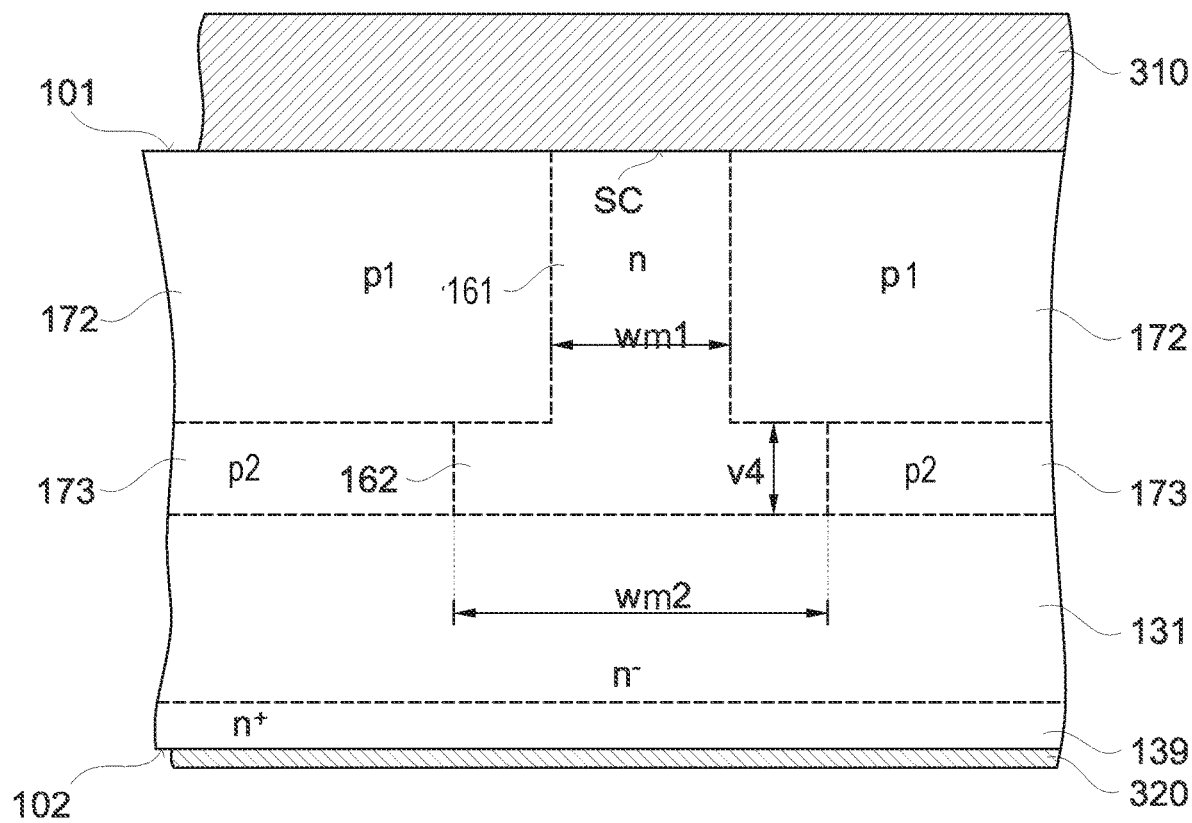
Figure 12A:
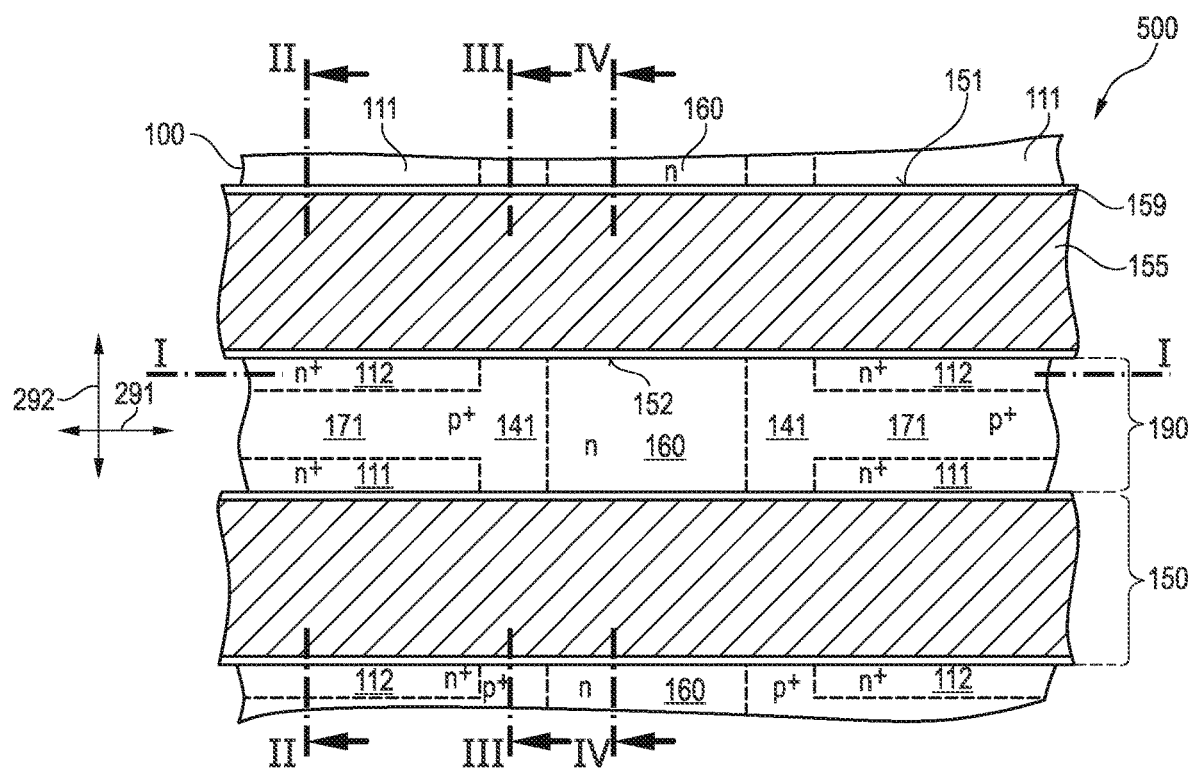
FIGS. 12A-12E illustrate schematic plan and vertical cross-sectional views of a portion of a silicon carbide device according to an embodiment related to symmetric transistor cells.
Figure 12B:
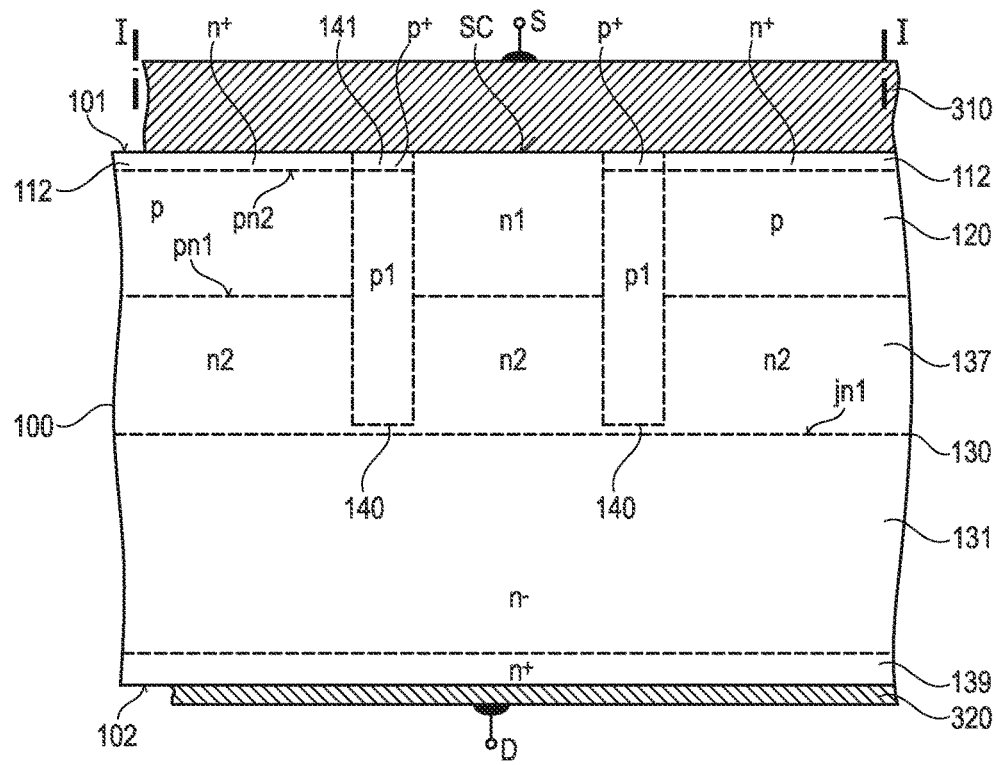
Figure 12C:
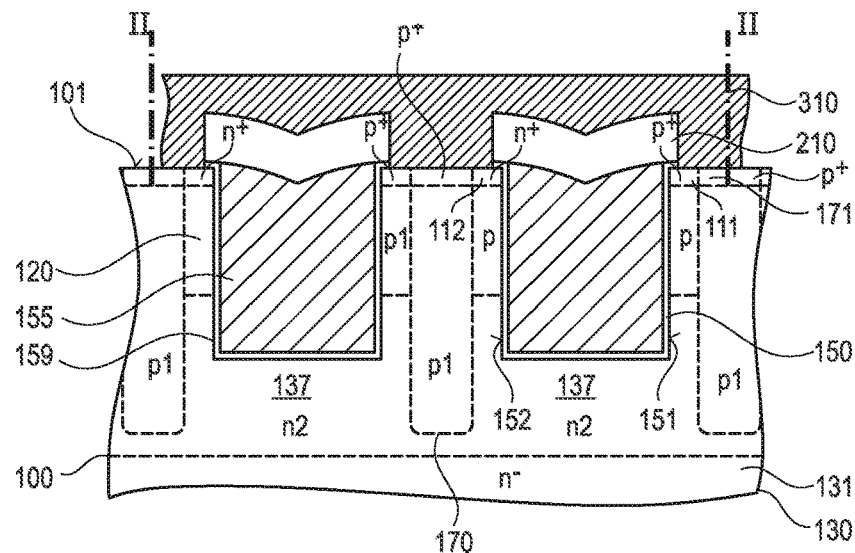
Figure 12D:
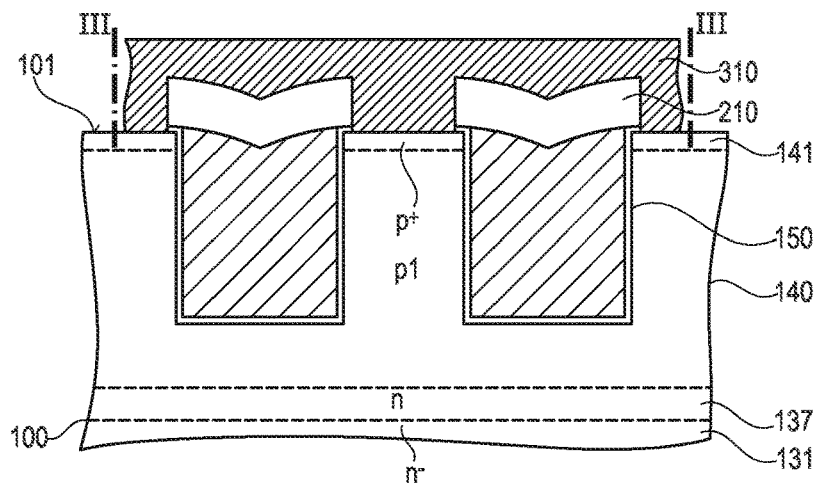
Figure 12E:
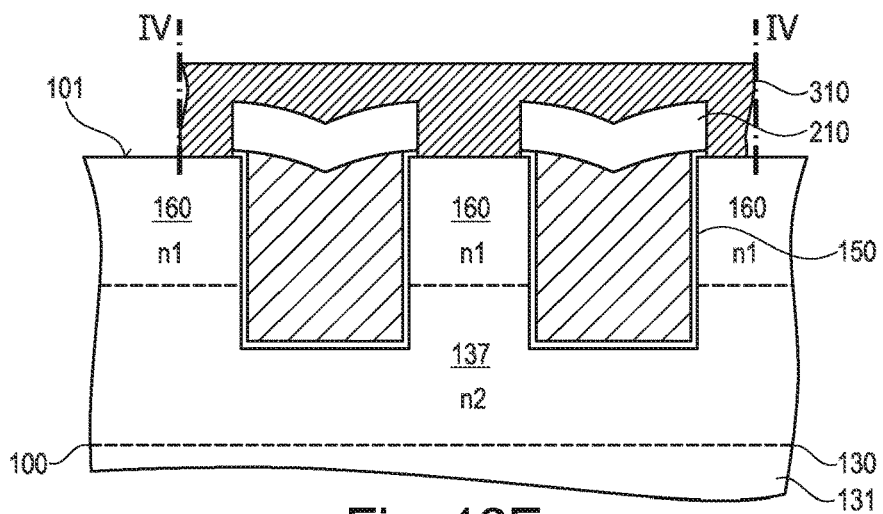

As illustrated in FIGS. 9A and 9E, the spacing regions 145 may be lateral extensions of the shielding regions 170 and may include the sub-portions that correspond to the shielding contact portion 171, the shielding connection portion 172, and the shielding bottom portion 173. Alternatively and/or additionally, the spacing regions 145 may differ from the shielding regions 170 by at least one implant.

In FIGS. 10A-10E spacing regions 145 separate the cathode region 160 from both neighboring gate structures 150. As illustrated in the figures, the spacing regions 145 and the separation regions 140 may be formed as lateral extensions of the shielding regions 170.

The cathode region 160 may include a lower cathode portion 162 and an upper cathode portion 161 between the lower cathode portion 162 and the first surface 101. A maximum first width w1 orthogonal to the first direction 291 in the upper cathode portion 161 may be smaller than a maximum second width w2 of the lower cathode portion 162. The lower cathode portion 162 may be formed contemporaneously with the current spread regions 137 by using the same implant processes and/or may have the same vertical dopant profile as the current spread regions 137. A maximum dopant concentration in the upper cathode portion 161 may be equal to or greater than a maximum dopant concentration in the lower cathode portion 162. Decoupling the position of the edges between the spacing regions 145 and the upper cathode portions 161 from the position of the edges between the spacing regions 145 and the lower cathode portions 162 may fine tune a trade-off between conductivity and shielding. Additional shallow n-type implants in the upper cathode portion 161 may also overcompensate implant p+ tails reaching to the first surface 101.

FIGS. 11A-11E show a further silicon carbide device 500 with a silicon carbide body 100. Transistor cells TC with gate structures 150 extending along the lateral first direction 291 are formed along a first surface 101 of the silicon carbide body 100. A drift structure with a lightly doped drift zone 131 is formed between the transistor cells TC and a second surface 102 of the silicon carbide body 100. The silicon carbide body 100 further includes shielding regions 170 and cathode regions 160 as described above and the semiconductor device 500 further includes a first load electrode 310 on the silicon carbide body rear side and a second load electrode 320 on the silicon carbide body rear side as described above.

Each cathode region 160 may extend from the first surface 101 into the silicon carbide body 100. The cathode regions 160 and the drift zone 131 have the same conductivity type. A mean dopant concentration in the cathode regions 160 may be the same as or may be higher than the mean dopant concentration in the drift zone 131. For example, a mean dopant concentration in the cathode region 160 may be at least double a mean dopant concentration in the drift zone 131. The cathode region 160 and the drift structure, e.g. the drift zone 131 or a barrier layer of the conductivity type of the drift zone 131, may form a unipolar junction. A length of the cathode region 160 along the first direction 291 may be at least 100 nm. For example, the length of the cathode regions 160 may be at least 500 nm, for example at least 1 µm, or at least 2 µm and/or at most 5 µm, for example at most 2 µm.

The cathode regions 160 and the first load electrode 310 form Schottky contacts SC. Along the lateral first direction 291 each Schottky contact SC is formed between two neighboring transistor cells TC.

Each shielding region 170 includes a shielding connection portion 172 and a shielding bottom portion 173. The shielding connection portion 172 is between the first surface 101 and the shielding bottom portion 173. The shielding connection portion 172 may further include a shielding contact portion formed along the first surface 101 as described above.

The shielding regions 170 include lateral spacer portions 174. Each spacer portion 174 is in contact with an active sidewall of a gate structure 150 between neighboring source regions 110. The shielding region 170 laterally surrounds each cathode region 160 completely. Each cathode region 160 may be spaced from both neighboring gate structures 150.

Each cathode region 160 includes a lower cathode portion 162 and an upper cathode portion 161 between the first surface 101 and the lower cathode portion 162. A mean dopant concentration in the lower cathode portion 162 and a mean dopant concentration in the upper cathode portion 161 may be equal or may be different. The upper cathode portion 161 has a first mean width wm1 along the first direction 291. The lower cathode portion 162 has a second mean width wm2 along the first direction 291. The second mean width wm2 is at least 120%, for example at least 150% or at least 200% of the first mean width wm1. A vertical extension v4 of the lower cathode portion 162 may be at least 50 nm, for example at least 100 nm.

The upper cathode portion 161 is laterally opposite to the shielding connection portion 172. The upper cathode portion 161 and the shielding connection portion 172 may form a vertical or almost vertical pn junction. The lower cathode portion 162 is laterally opposite to the shielding bottom portion 173. The lower cathode portion 162 and the shielding bottom portion 173 may form a vertical or almost vertical pn junction. A high unipolar reverse current may flow through the cathode region 160 without that the body diode becomes active.

FIGS. 12A-12E show a silicon carbide device 500 with symmetric transistor cells. First source regions 111 adjoin (e.g., directly adjoin) first gate sidewalls 151 of each trench gate structure 150 and second source regions 112 adjoin (e.g., directly adjoin) a second gate sidewall 152, wherein the first and second source regions 111, 112 are formed opposite (e.g., directly opposite) to each other. In the center of the SiC mesas 190 between the first and second source regions 111, 112, shielding regions 170 may extend from the first surface 101 into the silicon carbide body 100.

FIGS. 13A-15B show plan views of semiconductor devices 500 with stripe-shaped trench gate structures 150 running along the first direction 291. SiC mesas 190 between neighboring trench gate structures 150 include the semiconducting portions of the transistor cells TC and Schottky contacts SC with source regions 110, cathode regions 160 and separation regions 140 that separate neighboring cathode regions 160 and source regions 110.

Figure 13A:
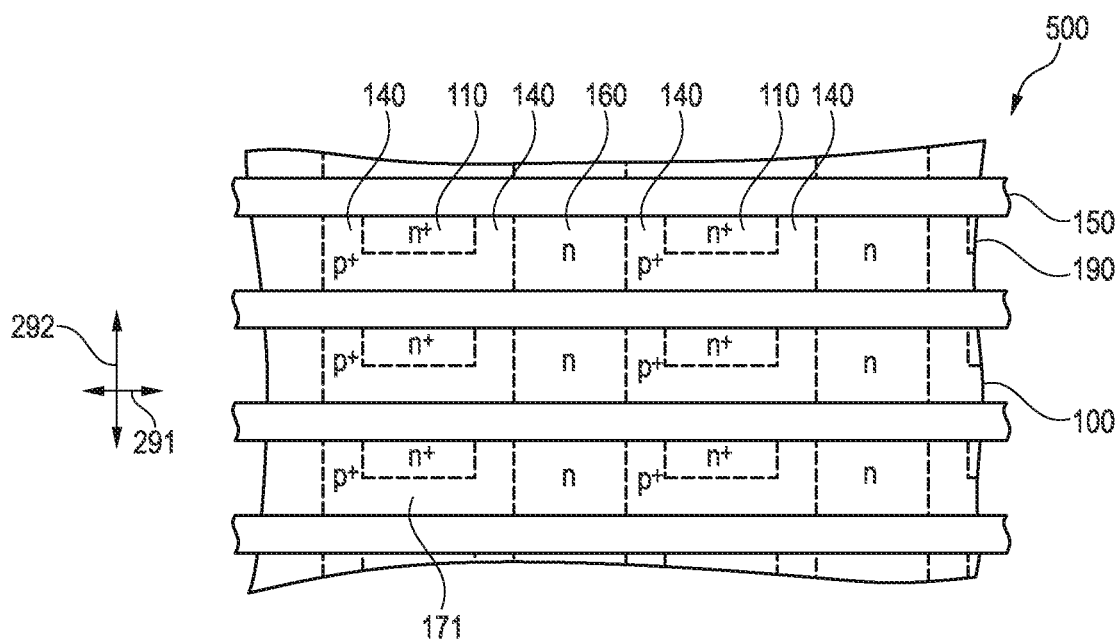
FIGS. 13A-13B illustrate schematic plan views of portions of a silicon carbide device according to embodiments with cathode regions adjoining both neighboring gate structures.
Figure 13B:
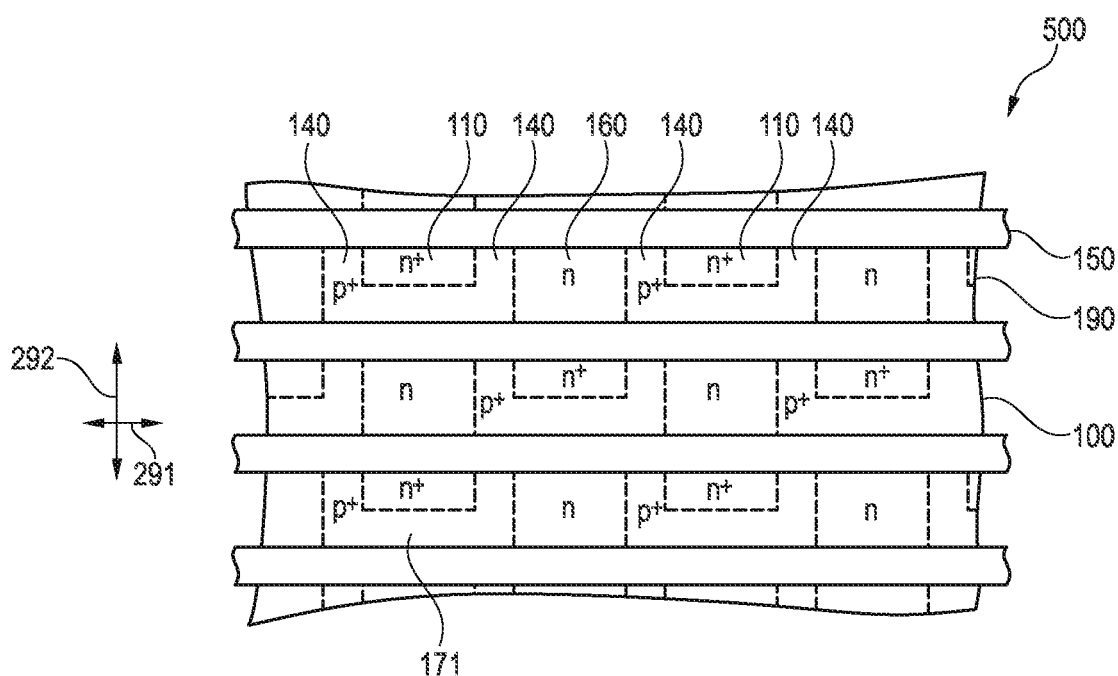

FIGS. 13A and 13B show cathode regions 160 that extend across the complete width of the semiconductor mesas 190.

In FIG. 13A, the cathode regions 160 of neighboring SiC mesas 190 extend along a lateral second direction 292 orthogonal to the first direction 291. The cathode regions 160 may thus extend along lines extending along the second direction 292.

In FIG. 13B the cathode regions 160 (e.g., only the cathode regions 160) in each second SiC mesa 190 are arranged along the same line along the second direction 292. In other words, along the second direction 292, cathode regions 160 alternate with source regions 110.

Figure 14A:
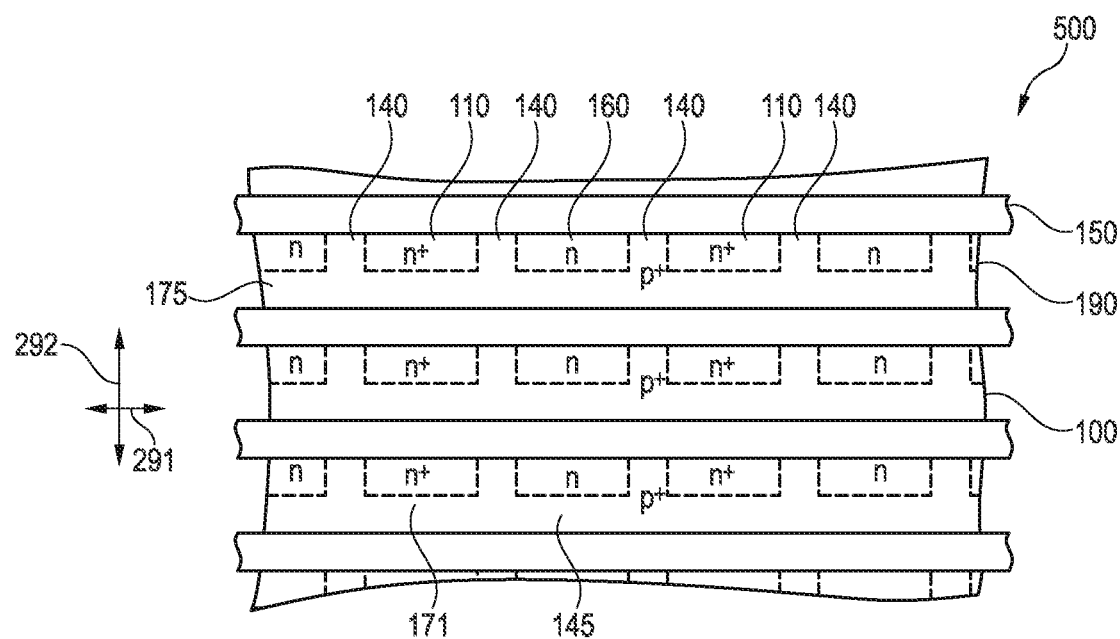
FIGS. 14A-14B illustrate schematic plan views of portions of a silicon carbide device according to embodiments with cathode regions in contact with one of two neighboring gate structures.
Figure 14B:
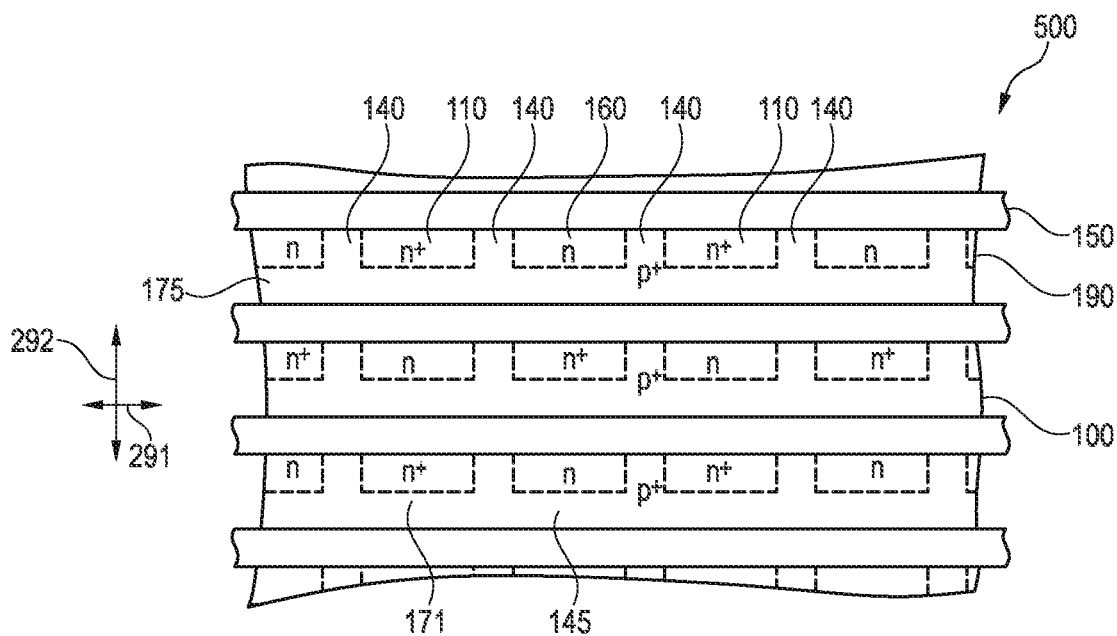

The embodiments shown in FIGS. 14A and 14B combine the arrangement of Schottky contacts SC and transistor cells TC as illustrated in FIGS. 13A and 13B with the layout of a Schottky contact SC with a spacing region 145 separating the cathode region 160 from one of the neighboring gate structures 150.

Figure 15A:
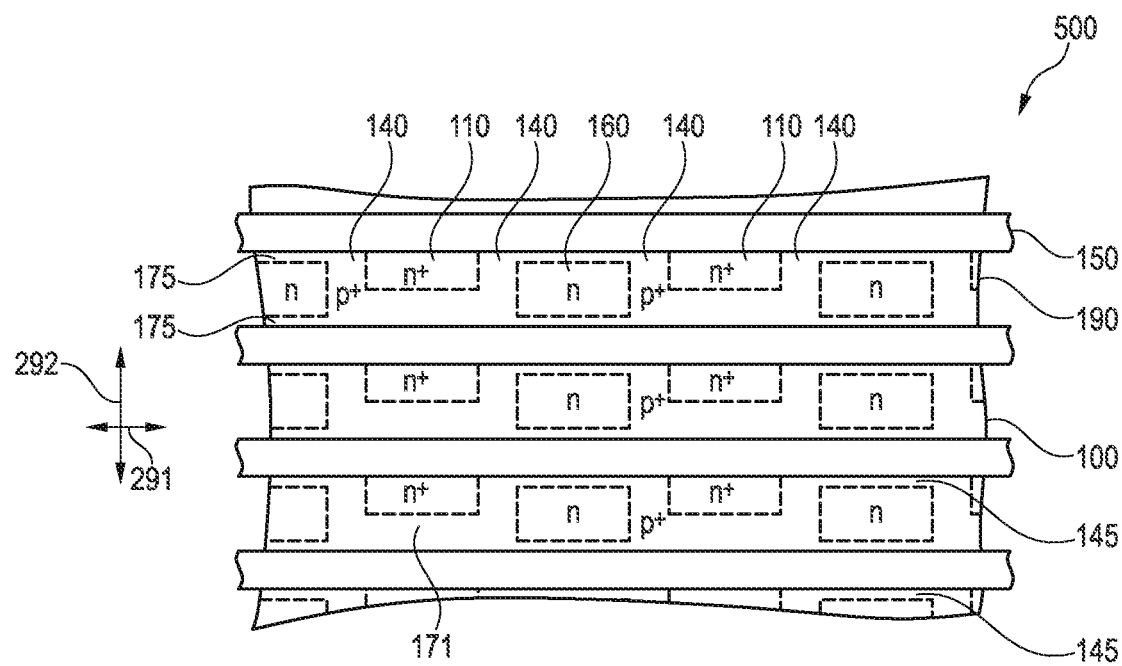
FIGS. 15A-15B illustrate schematic plan views of portions of a silicon carbide device according to embodiments with cathode regions separated from both neighboring trench gate structures.
Figure 15B:
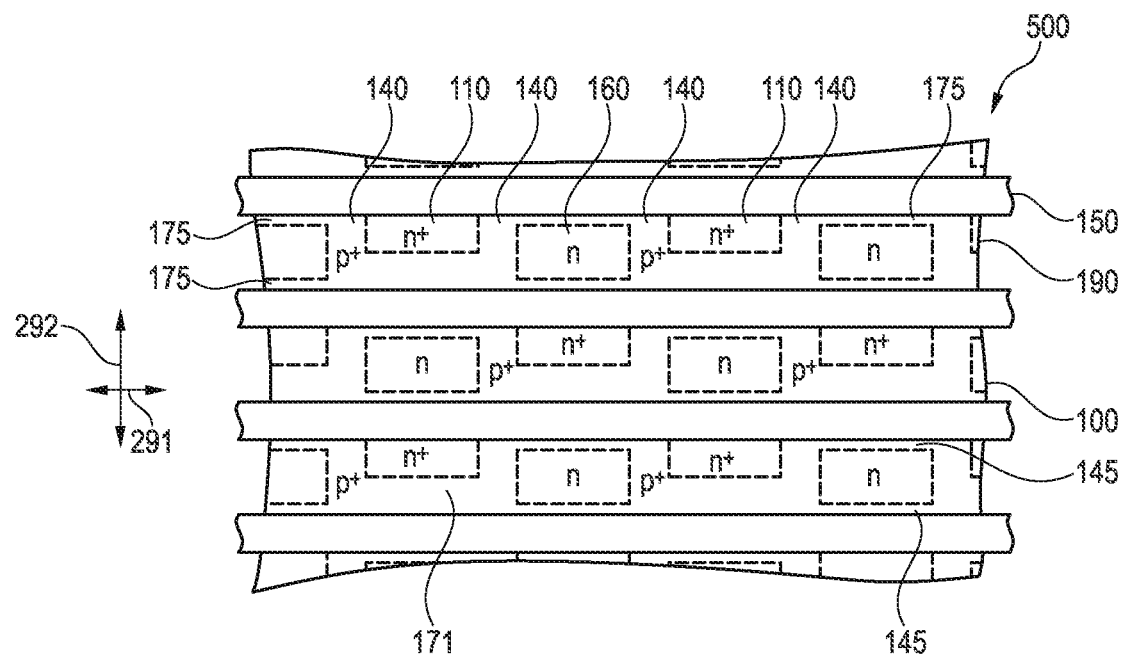

The embodiments shown in FIGS. 15A and 15B combine the arrangement of Schottky contacts SC and transistor cells TC as illustrated in FIGS. 13A and 13B with the layout of a Schottky contact with spacing regions 145 separating the cathode region 160 from both neighboring gate structures 150.

What is claimed is:

1. A silicon carbide device, comprising:
   a silicon carbide body comprising a source region of a first conductivity type, a cathode region of the first conductivity type and separation regions of a second conductivity type,
   a stripe-shaped gate structure extending along a first direction and adjoining the source region and adjoining the separation regions, and
   a first load electrode,
   wherein along the same first direction along which the stripe-shaped gate structure extends, the cathode region is between two separation regions of the separation regions and at least one separation region of the separation regions is between the cathode region and the source region,
   wherein the source region and the first load electrode form an ohmic contact, and
   wherein the first load electrode and the cathode region form a Schottky contact.

2. The silicon carbide device according to claim 1, wherein
   the stripe-shaped gate structure comprises a gate electrode formed on a first surface of the silicon carbide body.

3. The silicon carbide device according to claim 1, wherein
   the stripe-shaped gate structure extends from a first surface of the silicon carbide body into the silicon carbide body.

4. The silicon carbide device according to claim 1, wherein
   the silicon carbide body comprises a body region of the second conductivity type and a drift structure, wherein the body region and the drift structure form a first pn junction and wherein the first load electrode and the body region form a second ohmic contact.

5. The silicon carbide device according to claim 4, wherein
   a first vertical extension of the separation regions is equal to or smaller than a maximum vertical distance between the first pn junction and a first surface of the silicon carbide body.

6. The silicon carbide device according to claim 4, wherein
   a first vertical extension of the separation regions is greater than a maximum vertical distance between the first pn junction and a first surface of the silicon carbide body.

7. The silicon carbide device according to claim 4, wherein
   the drift structure comprises a drift zone of the first conductivity type, wherein the cathode region and the drift zone form a unipolar junction, and wherein a maximum dopant concentration in the cathode region is at least double a maximum dopant concentration in the drift zone.

8. The silicon carbide device according to claim 1, comprising:
   at least one dividing region of the second conductivity type, wherein the at least one dividing region separates the cathode region into at least two cathode portions along the first direction.

9. The silicon carbide device according to claim 1, wherein
   a plurality of cathode regions and a plurality of source regions are arranged along the first direction,
   wherein each cathode region of the plurality of cathode regions is between two corresponding separation regions of the separation regions, and
   wherein at least one separation region of the separation regions is between at least one cathode region of the plurality of cathode regions and at least one source region of the plurality of source regions.

10. The silicon carbide device according to claim 3, wherein
    the source region adjoins a first gate sidewall of the stripe-shaped gate structure and wherein opposite to the source region, a shielding region of the second conductivity type adjoins a second gate sidewall of the stripe-shaped gate structure opposite the first gate sidewall.

11. The silicon carbide device according to claim 3, comprising:
    a first source region and a second source region,
    wherein the first source region adjoins a first gate sidewall of the stripe-shaped gate structure and, opposite to the first source region, the second source region adjoins a second gate sidewall opposite the first gate sidewall.

12. The silicon carbide device according to claim 1, comprising:
    a plurality of parallel gate structures comprising the stripe-shaped gate structure, wherein the cathode region extends from one gate structure of the plurality of parallel gate structures to a neighboring gate structure of the plurality of parallel gate structures.

13. The silicon carbide device according to claim 1, comprising:
a plurality of parallel gate structures comprising the stripe-shaped gate structure, wherein a spacing region of the second conductivity type is formed between one gate structure of the plurality of parallel gate structures and the cathode region.

14. The silicon carbide device according to claim 1, comprising:
a plurality of parallel gate structures comprising the stripe-shaped gate structure, wherein spacing regions of the second conductivity type are formed between the cathode region and two gate structures of the plurality of parallel gate structures.

15. The silicon carbide device according to claim 14, wherein
the cathode region comprises a lower cathode portion and an upper cathode portion between the lower cathode portion and a first surface, wherein a maximum first width of the upper cathode portion orthogonal to the first direction is smaller than a maximum second width of the lower cathode portion orthogonal to the first direction.

16. The silicon carbide device according to claim 1, wherein
a plurality of cathode regions comprising the cathode region and a plurality of source regions comprising the source region are arranged between a plurality of parallel gate structures comprising the stripe-shaped gate structure, and
wherein the plurality of cathode regions are arranged along the first direction and the plurality of source regions are arranged along a second direction orthogonal to the first direction.

17. The silicon carbide device according to claim 1, wherein
a plurality of cathode regions comprising the cathode region and a plurality of source regions comprising the source region are arranged between a plurality of parallel gate structures comprising the stripe-shaped gate structure, and
wherein the plurality of cathode regions and the plurality of source regions alternate along a second direction orthogonal to the first direction.

18. A silicon carbide device, comprising:
a silicon carbide body comprising a source region, a cathode region and separation regions,
a stripe-shaped gate structure extending along a first direction and directly adjoining the source region and directly adjoining the separation regions, and
a first load electrode,
wherein along the same first direction along which the stripe-shaped gate structure extends, the cathode region is between two separation regions of the separation regions and at least one separation region of the separation regions is between the cathode region and the source region,
wherein the source region and the first load electrode form an ohmic contact, and
wherein the first load electrode and the cathode region form a Schottky contact.

19. The silicon carbide device according to claim 18, wherein
the stripe-shaped gate structure comprises a gate electrode formed on a first surface of the silicon carbide body.

20. A silicon carbide device, comprising:
a silicon carbide body comprising a source region, a cathode region and separation regions,
a stripe-shaped gate structure extending along a first direction and adjoining the source region and adjoining the separation regions, and
a first load electrode,
wherein along the same first direction along which the stripe-shaped gate structure extends, the cathode region is between two separation regions of the separation regions and at least one separation region of the separation regions is between the cathode region and the source region,
wherein the source region and the first load electrode form an ohmic contact,
wherein the first load electrode and the cathode region form a Schottky contact, and
wherein the stripe-shaped gate structure extends from a first surface of the silicon carbide body into the silicon carbide body.

* * * * *